(12) United States Patent
Kim

(10) Patent No.: US 9,438,102 B2
(45) Date of Patent: Sep. 6, 2016

(54) PHASE LOCKED LOOP HAVING DUAL BANDWIDTH AND METHOD OF OPERATING THE SAME

(71) Applicant: SAMSUNG ELECTRONICS CO., LTD., Suwon-Si, Gyeonggi-Do (KR)

(72) Inventor: Sung-Jin Kim, Ulsan (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 3 days.

(21) Appl. No.: 14/591,453

(22) Filed: Jan. 7, 2015

(65) Prior Publication Data

US 2015/0288367 A1    Oct. 8, 2015

(30) Foreign Application Priority Data

Apr. 2, 2014 (KR) .................. 10-2014-0039557

(51) Int. Cl.

| | |
|---|---|
| *H02M 3/07* | (2006.01) |
| *H03J 1/00* | (2006.01) |
| *H03L 7/087* | (2006.01) |
| *H03L 7/089* | (2006.01) |
| *H03L 7/18* | (2006.01) |

(52) U.S. Cl.
CPC ............... *H02M 3/07* (2013.01); *H03J 1/005* (2013.01); *H03L 7/087* (2013.01); *H03L 7/0891* (2013.01); *H03L 7/18* (2013.01)

(58) Field of Classification Search
USPC .............. 327/2–12, 105–123, 141, 144–163; 331/1 A, 15–17; 375/373–376
See application file for complete search history.

(56) References Cited

U.S. PATENT DOCUMENTS

| | | | |
|---|---|---|---|
| 6,094,078 A * | 7/2000 | Suzuki ................... | H03L 7/087 327/156 |
| 6,111,470 A | 8/2000 | Dufour | |
| 6,404,291 B1 * | 6/2002 | Riley ..................... | H03K 21/10 327/117 |
| 7,999,622 B2 | 8/2011 | Galton et al. | |
| 2008/0191746 A1 * | 8/2008 | Friedman ............. | H03D 13/004 327/5 |
| 2013/0187689 A1 | 7/2013 | Choi | |
| 2013/0214832 A1 * | 8/2013 | Palwai ................. | H03L 7/0891 327/156 |

* cited by examiner

*Primary Examiner* — Brandon S Cole
(74) *Attorney, Agent, or Firm* — Volentine & Whitt, PLLC

(57) ABSTRACT

A phase locked loop having a dual bandwidth is disclosed. The phase locked loop divides a loop filter into a zero filter and a pole filter, disposes the zero filter in front of a phase-frequency detector (PFD), and performs high-pass filtering on a voltage-controlled oscillator (VCO) noise with a maximum bandwidth and performs low-pass filtering on a charge pump noise (CP noise) with a minimum bandwidth to divide the VCO noise and the CP noise.

15 Claims, 20 Drawing Sheets narrow bandwidth optimum bandwidth wide bandwidth dual bandwidth

PHASE LOCKED LOOP HAVING DUAL BANDWIDTH AND METHOD OF OPERATING THE SAME

CROSS-REFERENCE TO RELATED APPLICATION

A claim for priority under 35 U.S.C. §119 is made to Korean Patent Application No. 10-2014-0039557 filed on Apr. 2, 2014, in the Korean Intellectual Property Office, the entire contents of which are hereby incorporated by reference.

BACKGROUND

Embodiments of the inventive concept relate to a phase locked loop, and more particularly, to a phase locked loop having a dual bandwidth and a method of operating the phase locked loop.

A charge-pump-type phase locked loop is used to generate a system clock for various digital devices. The output signal of the charge-pump-type phase locked loop may include various noise, such as a charge pump noise (CP noise) and a voltage-controlled oscillator noise (VCO noise), for example. It is desirable to provide a phase locked loop with reduced noise and thus improved noise properties.

SUMMARY

Embodiments of the inventive concept provide a phase locked loop having an improved noise property. Other embodiments of the inventive concept provide a method of operating a phase locked loop having an improved noise property.

The technical objectives of the inventive concept are not limited to the present disclosure; and other objectives may become apparent to those of ordinary skill in the art based on the following descriptions.

In accordance with an aspect of the inventive concept, a phase locked loop (PLL) includes a time-difference memory, a first phase-frequency detector, a second phase-frequency detector, first and second charge pumps, a pole filter, a voltage-controlled oscillator (VCO), and frequency divider. The time-difference memory is configured to store a first time difference between a reference input signal and a feedback signal. The first phase-frequency detector is configured to generate a first up signal and a first down signal based on a second time difference, which is a current time difference, between the reference input signal and the feedback signal. The second phase-frequency detector is configured to generate a second up signal and a second down signal based on the first time difference received from the time-difference memory. The first charge pump is configured to generate a first charge current and a first discharge current in response to the first up signal and the first down signal. The second charge pump is configured to generate a second charge current and a second discharge current in response to the second up signal and the second down signal. The pole filter is configured to perform filtering on the first charge current, the first discharge current, the second charge current and the second discharge current to generate an oscillation control signal. The VCO is configured to generate an output signal having a frequency that changes in response to the oscillation control signal. The frequency divider is configured to divide the frequency of the output signal to generate the feedback signal.

VCO noise of the VCO may have a high-pass property at an output node, and charge pump (CP) noise of the first and second charge pumps may have a low-pass property at the output node.

The PLL may have dual bandwidths comprising a first bandwidth with respect to VCO noise of the VCO and a second bandwidth with respect to charge pump (CP) noise of the first ad second charge pumps, the first bandwidth being a broad bandwidth and the second bandwidth being a narrow bandwidth. The first bandwidth may be determined by a loop bandwidth of the PLL, and the second bandwidth may be determined by a zero filter. The zero filter is configured to include the time-difference memory, a time-difference amplifier and a time-difference adder. Because the PLL has dual bandwidths, a size of a capacitor included in the pole filter may decrease and amounts of an output current of the first charge pump and an output current of the second charge pump may decrease.

The PLL may further include a zero filter for filtering in a time-difference domain. A transfer function of the zero filter may be configured to be represented by $(A(1-Z_T^{-1})+1)$ in a Z-domain when an amplifier gain is A and a time-difference function is $Z_T^{-1}$. The time-difference function $(Z_T^{-1})$ may be configured to be implemented by a time-difference memory or a time-difference register. A transfer function of the zero filter may be configured to be represented by $((A+1)+(-A*Z_T^{-1}))$, and a gain ratio between A and (A+1) may be implemented by a ratio of output currents of the first charge pump and the second charge pump, and a negative gain of −A may be implemented by inverting a polarity of an output pair of the second phase-frequency detector and applying the inverted output pair to the second charge pump. The time-difference memory having the time-difference function $(Z_T^{-1})$ may be configured to include a delay that delays the reference input signal and the feedback signal.

In accordance with another aspect of the inventive concept, a method is provided for operating a PLL. The method includes performing filtering using a zero filter in a time-difference domain on a reference input signal and a feedback signal to generate a first signal; performing filtering using a pole filter on the first signal to generate an oscillation control signal; and generating an output signal having a frequency that changes in response to the oscillation control signal.

A transfer function of the zero filter may be configured to be represented by $(A(1-Z_T^{-1})+1)$ in a Z-domain when an amplifier gain is A and a time-difference function is $Z_T^{-1}$.

Generating the first signal may include storing a first time difference between a reference input signal and a feedback signal in a time-difference memory; generating a first up signal and a first down signal based on a second time difference, which is a current time difference, between the reference input signal and the feedback signal; generating a second up signal and a second down signal based on the first time difference received from the time-difference memory; generating a first charge current and a first discharge current in response to the first up signal and the first down signal; and generating a second charge current and a second discharge current in response to the second up signal and the second down signal. The generating of the first signal may further include summing the first charge current, the first discharge current, the second charge current and the second discharge current.

In accordance with another aspect of the inventive concept, a PLL includes a time-difference memory, a multiplexer, a phase-frequency detector, a charge pump, a controller, a pole filter, a VCO and a frequency divider. The time-difference memory is configured to store a first time difference between a reference input signal and a feedback signal. The multiplexer is configured to output one of the first time difference received from the time-difference memory and a second time difference that is a current time difference between the reference input signal and the feedback signal. The phase-frequency detector is configured to generate an up signal and a down signal based on an output signal of the multiplexer. The charge pump is configured to generate a charge current and a discharge current in response to the up signal and the down signal. The controller is configured to generate control signals based on the up signal and the down signal, and to control the multiplexer and the charge pump using the control signals. The pole filter is configured to perform filtering on the charge current and the discharge current to generate an oscillation control signal. The VCO is configured to generate an output signal having a frequency that changes in response to the oscillation control signal. The frequency divider is configured to divide the frequency of the output signal to generate the feedback signal.

VCO noise of the VCO may have a high-pass property at an output node, and charge pump (CP) noise of the charge pump may have a low-pass property at the output node. The PLL may have dual bandwidths comprising a first bandwidth with respect to VCO noise of the VCO and a second bandwidth with respect to charge pump (CP) noise of the charge pump, the first bandwidth being a broad bandwidth and the second bandwidth being a narrow bandwidth.

The charge pump may include a first current source and a second current source, the up signal being applied to the first current source and the down signal being applied to the second current source the charge pump. The charge pump may be controlled using time-division multiplexing.

BRIEF DESCRIPTION OF THE DRAWINGS

Exemplary embodiments of the inventive concept will be more clearly understood from the following description taken in conjunction with the accompanying drawings, in which.

DETAILED DESCRIPTION OF THE EMBODIMENTS

Figure 1:
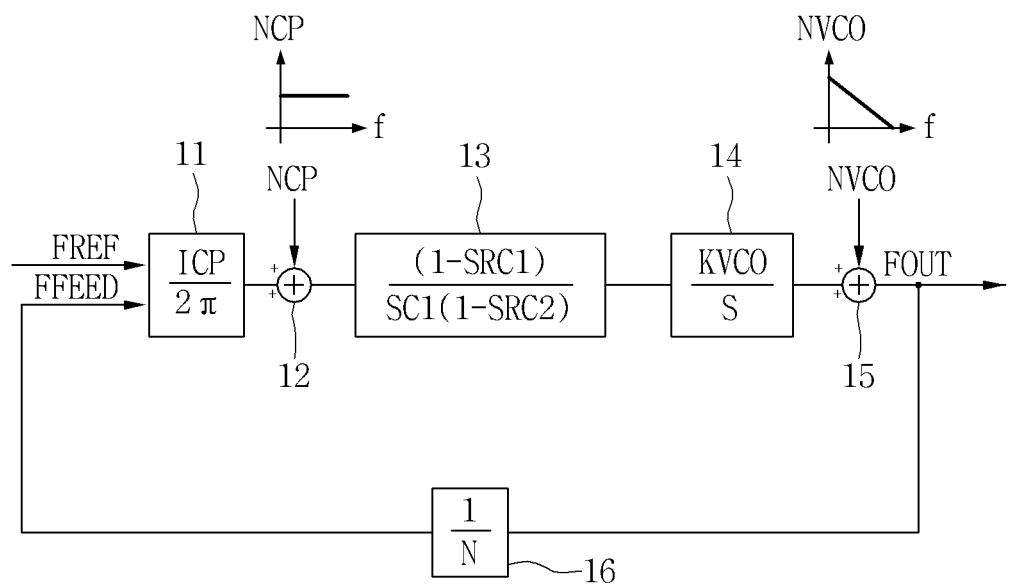
FIG. 1 is a diagram illustrating a linearized S-domain model and a noise transfer property of a conventional phase locked loop (PLL)

Embodiments will be described in detail with reference to the following description and accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to one of ordinary skill in the art. That is, various embodiments cover all modifications, equivalents, and alternatives falling within the spirit and scope of the inventive concept. Accordingly, known processes, elements, and techniques are not described with respect to some of the embodiments. Unless otherwise noted, like reference numerals denote like elements throughout the attached drawings and written description, and thus descriptions may not be repeated. The drawings are not necessarily to scale, emphasis instead being placed upon illustrating the principles of the inventive concepts. Also, in the drawings, the sizes and relative sizes of layers and regions may be exaggerated for clarity.

It will be understood that, although the terms "first," "second," "third," etc., may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section, for example, without departing from the teachings of the present inventive concept.

It will be understood that when an element or layer is referred to as being "on," "connected to," or "coupled with"

another element or layer, it can be directly on, connected, or coupled to the other element or layer, or intervening elements or layers may be present. In contrast, when an element is referred to as being "directly on," "directly connected to," or "directly coupled with" another element or layer, there are no intervening elements or layers present. Like numerals refer to like elements throughout. As used herein, the term "and/or" includes any and all combinations of one or more of the associated listed items.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When it is possible to implement an embodiment in another way, a function or an operation specified in a specific block in a process may be performed differently from the process specified in a flowchart. For example, the functions or the operations of two consecutive blocks may be performed simultaneously, or the functions or the operations of the two blocks may be performed in a different order, according to a related operation or function.

Embodiments of the inventive concept will now be described more fully with reference to the accompanying drawings.

FIG. 1 is a diagram illustrating a linearized S-domain model and a noise transfer property of a conventional phase locked loop (PLL). The linearized S-domain model shown in FIG. 1 is for a conventional charge-pump-type PLL. Generally, the conventional charge-pump-type PLL may include a phase-frequency detector (PFD), a charge pump, a loop filter, a voltage-controlled oscillator (VCO), and a frequency divider, and may generate a control signal of the VCO by the charge pump and the loop filter. The PFD compares a reference input signal FREF and a feedback signal FFEED, and drives the charge pump based on the comparison result. The loop filter is connected between a connection point of the charge pump and the VCO and the ground voltage, and may include a resistor and a first capacitor connected in series and a second capacitor. The first capacitor may have much larger capacitance than the second capacitor.

Referring to model 10 in FIG. 1, transfer functions for blocks are shown inside the blocks. Block 11 indicates the PFD and the charge pump, and generates a gain proportional to ICP according to a phase difference between the reference input signal FREF and the feedback signal FFEED, regardless of the frequency of the reference input signal FREF. Block 13 indicates the loop filter, and block 14 indicates the VCO. Block 16 indicates the frequency divider, and blocks 12 and 15 indicate adders. The adder 12 adds an output of the charge pump and charge pump noise NCP, and the adder 15 adds an output of the VCO and VCO noise NVCO. The charge pump noise NCP and the VCO noise NVCO may have waveforms as shown in FIG. 1. The VCO 14 generates a gain of KVCO and has one pole at the origin. The loop filter has one pole at the origin and an additional pole at a position of 1/RC2, and a zero at a position of 1/RC1.

The phase noise of an output of the PLL is mainly determined by the VCO noise NVCO (VCO noise) and the charge pump noise NCP (CP noise). The VCO noise may have a high-pass property at an output node, and the CP noise may have a low-pass property at the output node on the basis of a bandwidth of the PLL. There may be a trade-off relation between the VCO noise and the CP noise.

Figure 2A:
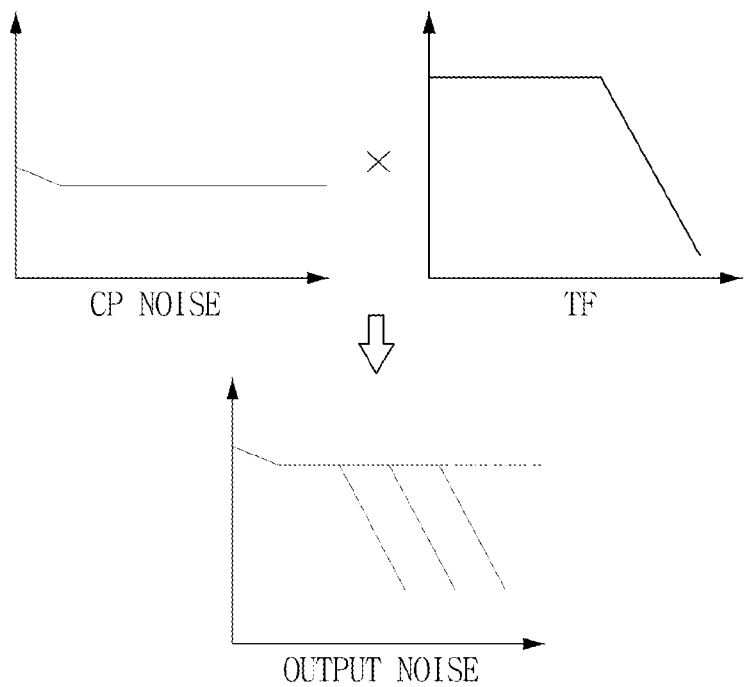
FIGS. 2A to 2C are diagrams illustrating noise of a charge pump (CP noise), noise of a voltage-controlled oscillator (VCO noise), and an optimum bandwidth setting, respectively.
Figure 2B:
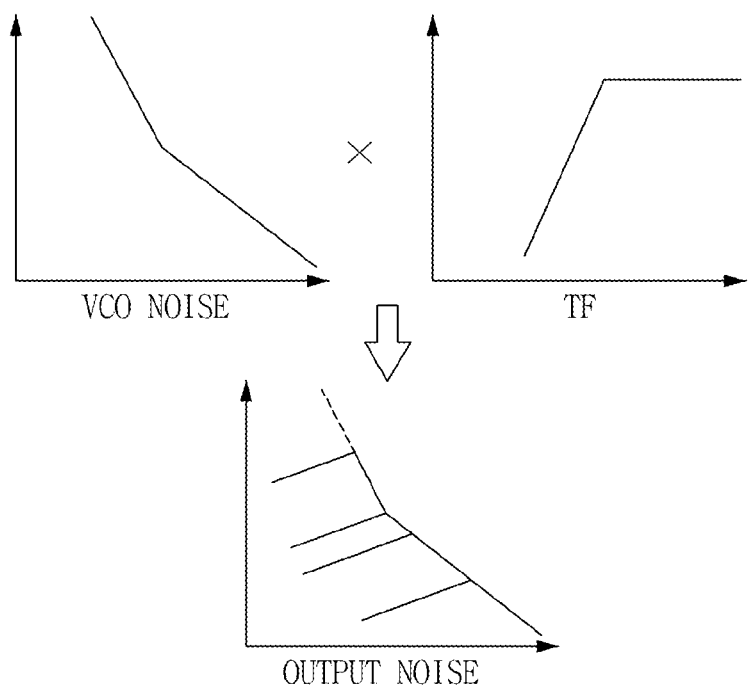
Figure 2C:
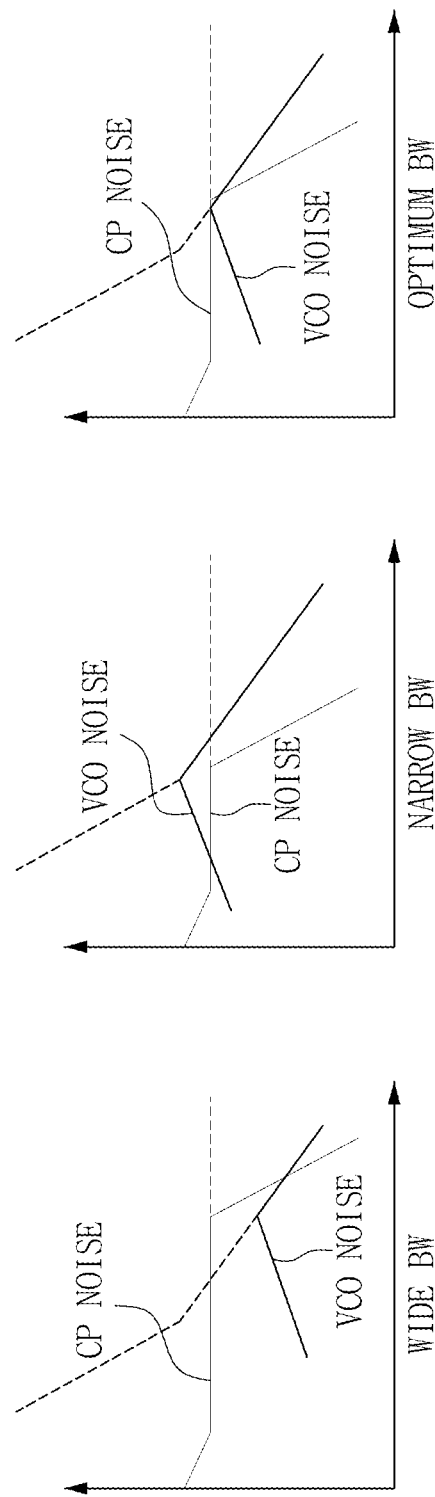

FIGS. 2A to 2C are diagrams illustrating CP noise, VCO noise, and an optimum bandwidth setting, respectively.

Referring to FIG. 2A, the output noise caused by the CP noise is represented by a graph in which the CP noise and a transfer function TF of the CP noise at the output node are multiplied. Referring to FIG. 2B, the output noise caused by the VCO noise is represented by a graph in which the VCO noise and a transfer function TF of the VCO noise at the output node are multiplied. Notably, the output noise caused by the VCO noise has a high-pass property, and the output noise caused by the CP noise may have a low-pass property.

Referring to FIG. 2C, the influence of the CP noise and the VCO noise on an output node of the PLL vary according to a loop bandwidth of the PLL. When the bandwidth of the PLL increases, the influence of the CP noise on the output node increases, but the influence of the VCO noise on the output node decreases. On the contrary, when the bandwidth of the PLL decreases, the influence of the CP noise on the output node decreases, but the influence of the VCO noise on the output node increases. Therefore, an optimum bandwidth may be set to minimize phase noise in a design of a conventional PLL.

Figure 3:
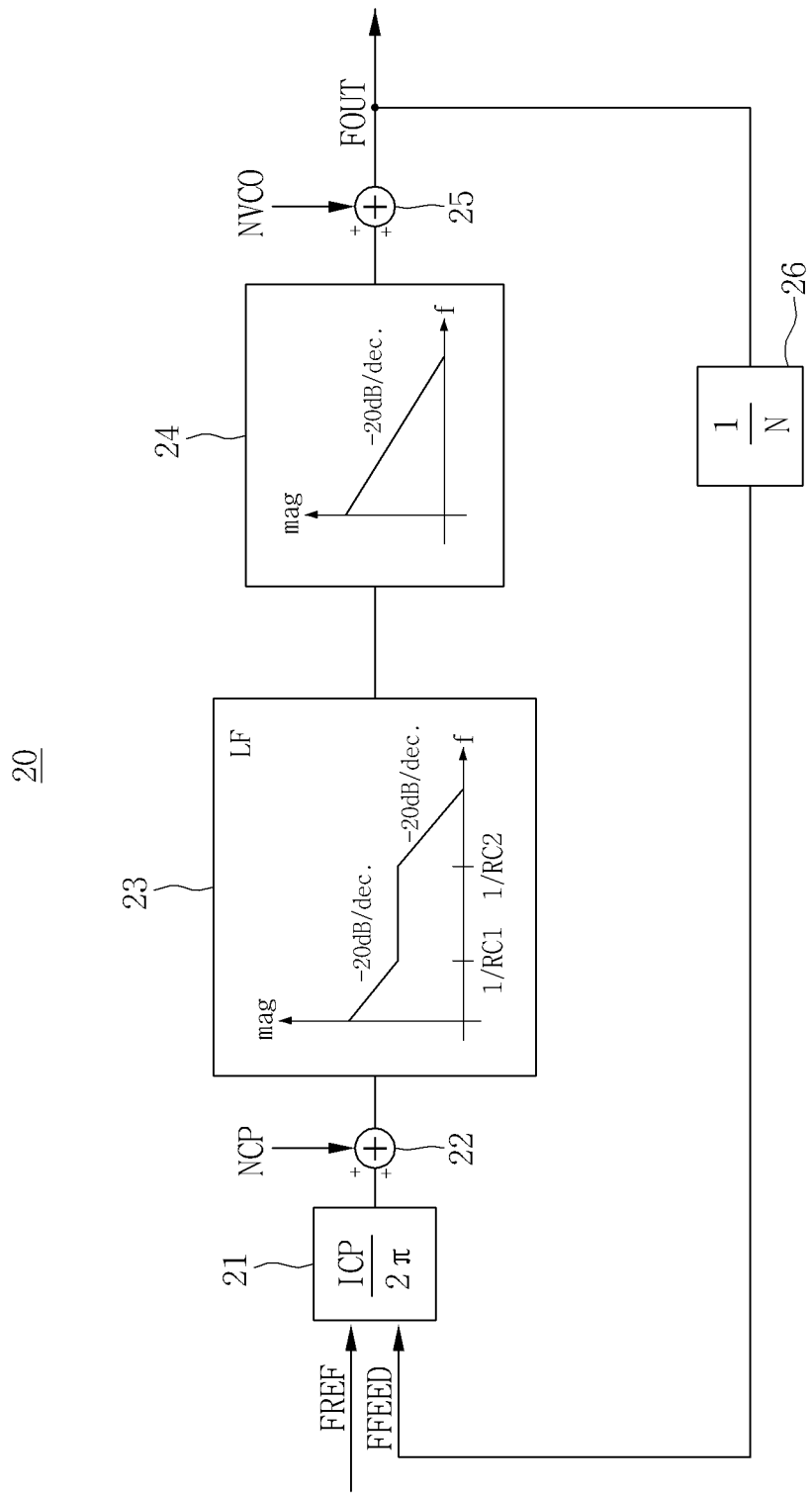
FIG. 3 is a diagram illustrating a frequency response property of a conventional PLL using a Bode plot.

FIG. 3 is a diagram illustrating a frequency response property of a conventional PLL using a Bode plot. In FIG. 3, block 21 corresponds to the block 11 in FIG. 1 and indicates the PH) and the charge pump. Block 23 corresponds to the block 13 in FIG. 1 and indicates the loop filter. Block 24 corresponds to the block 14 in FIG. 1 and indicates the VCO. The block 26 corresponds to the block 16 in FIG. 1 and indicates the frequency divider. Further, blocks 22 and 25 indicate adders, where the adder 22 corresponds to the adder 12 in FIG. 1 and the adder 25 corresponds to the adder 15 in FIG. 1.

Referring to FIG. 3, the loop filter 23 has poles at the origin and a position of 1/RC2, and a zero at a position of 1/RC1. The VCO 24 has a pole at the origin and has a characteristic that gain decreases by about 20 dB/dec. The loop filter 23 has a characteristic that gain decreases by about 20 dB/dec from the origin to the position of 1/RC1, has a constant value from the position of 1/RC1 to the position of 1/RC2, and decreases by about 20 dB/dec when frequency is greater than or equal to 1/RC2.

Figure 4:
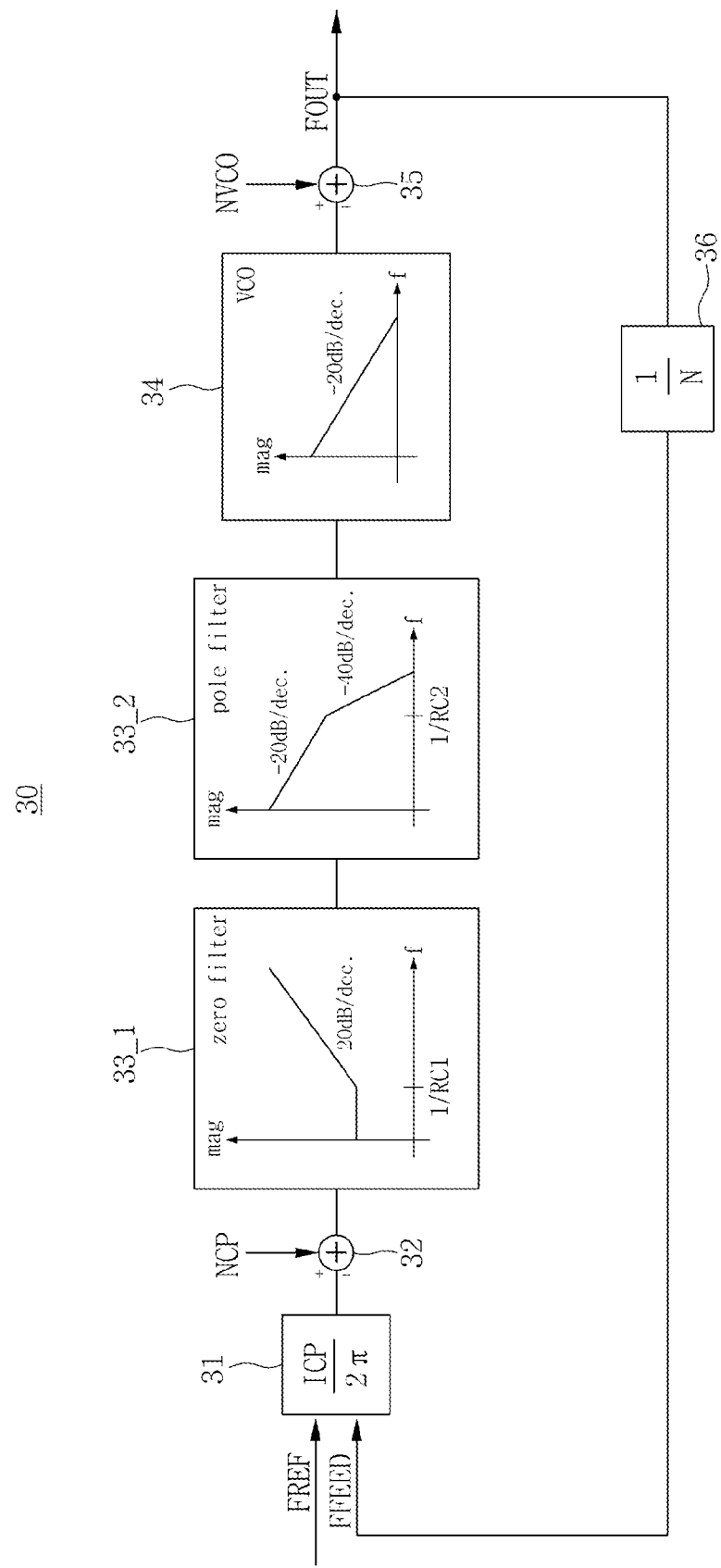
FIG. 4 is a diagram illustrating a first equivalent model corresponding to FIG. 3.
Figure 5:
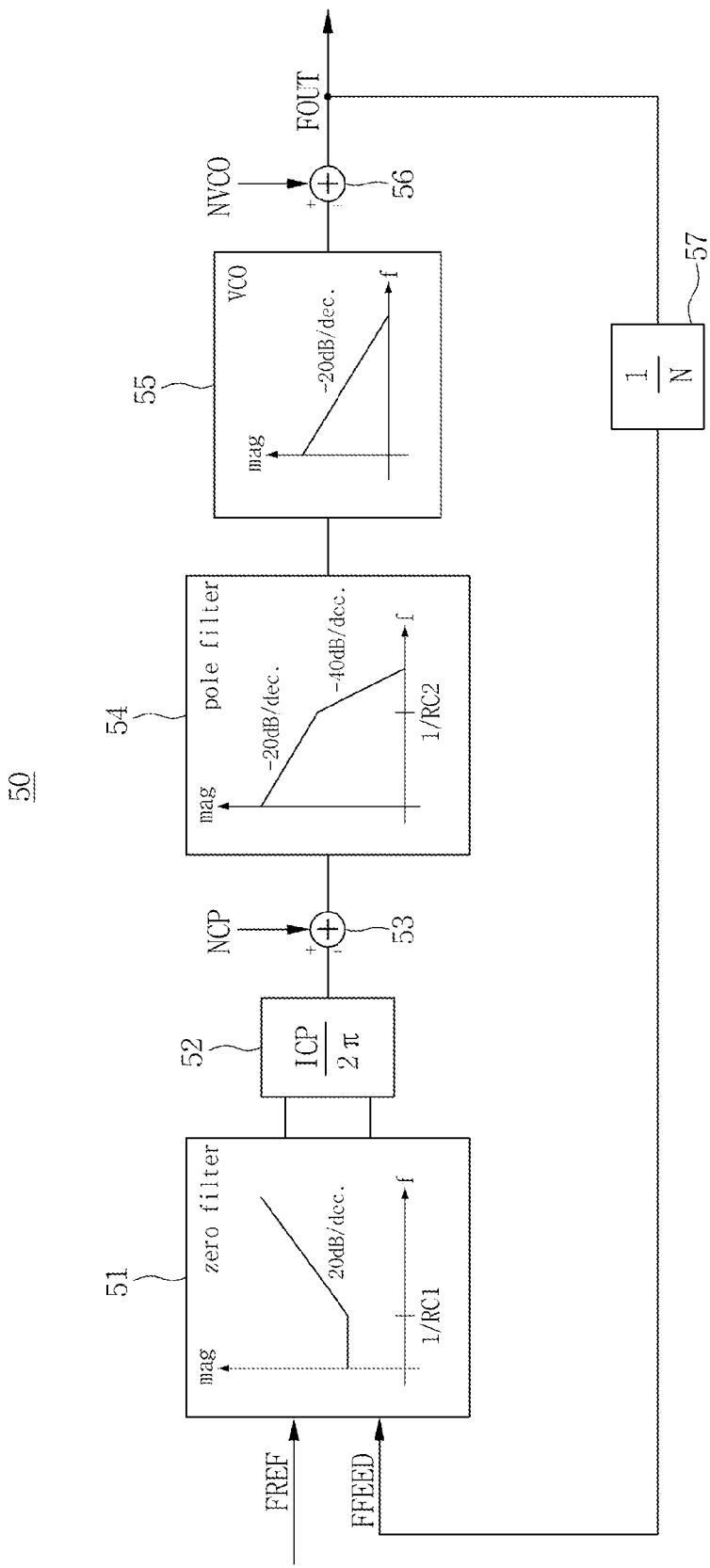
FIG. 5 is a diagram illustrating a second equivalent model corresponding to FIG. 3.

FIG. 4 is a diagram illustrating a first equivalent model 30 corresponding to FIG. 3, and FIG. 5 is a diagram illustrating a second equivalent model 50 corresponding to FIG. 3. FIGS. 4 and 5 are diagrams for describing the concept of a PLL having a dual bandwidth according to embodiments of the inventive concept.

Referring to FIG. 4, the loop filter 23 having a frequency characteristic shown in FIG. 3 may be divided into a zero filter 33_1 having a zero at the position of 1/RC1 and a pole filter 33_2 having a pole at the position of 1/RC2, as shown in the first equivalent model 30. The zero filter 33_1 may have characteristics in that gain has a constant value from the origin to the position of 1/RC1, and the gain increases by about 20 dB/dec when the frequency is greater than or equal to 1/RC1. The pole filter 33_2 may have characteristics in that gain decreases by about 20 dB/dec from the origin to the position of 1/RC2, and the gain decreases by about 40 dB/dec when the frequency is greater than or equal to 1/RC2. That is, the first equivalent model 30 of the PLL of FIG. 4 is a model in which the loop filter of the PLL is converted to a cascaded filter including an independent zero filter and an independent pole filter by separating the zero and the pole of the loop filter.

Referring to FIG. 5, block 51 corresponds to the block 33_1 in FIG. 4 and indicates the zero filter, and block 52 corresponds to the block 31 in FIG. 4 and indicates the PFD and the charge pump together. Block 54 corresponds to the block 33_2 in FIG. 4 and indicates the pole filter, and block 55 corresponds to the block 34 in FIG. 4 and indicates the VCO. Block 57 corresponds to the block 36 in FIG. 4 and indicates the frequency divider. Further, blocks 53 and 56 indicate adders.

The second equivalent model 50 of a PLL shown in FIG. 5, according to an embodiment of the inventive concept, is a model in which the zero filter 33_1 in the first equivalent model 30 of a PLL of FIG. 4 is disposed in front of the block 52 indicating the PH) and the charge pump. The second equivalent model 50 may have the same loop property as the conventional charge-pump-type PLL in view of the reference input signal FREF and the feedback signal FFEED. However, the transfer function of the CP noise performs low-pass filtering with the reference of 1/RC1 because of the zero filter added in front of the charge pump, though the transfer function of the VCO noise is the same as the conventional transfer function of the VCO noise shown in FIG. 1.

Figure 6A:
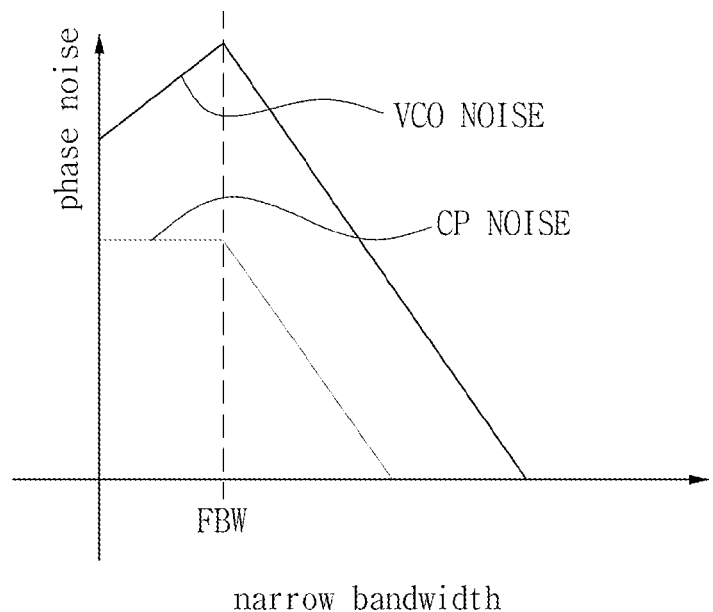
FIGS. 6A to 6D are diagrams illustrating noise properties according to bandwidth and separation of CP noise and VCO noise using the second equivalent model.
Figure 6B:
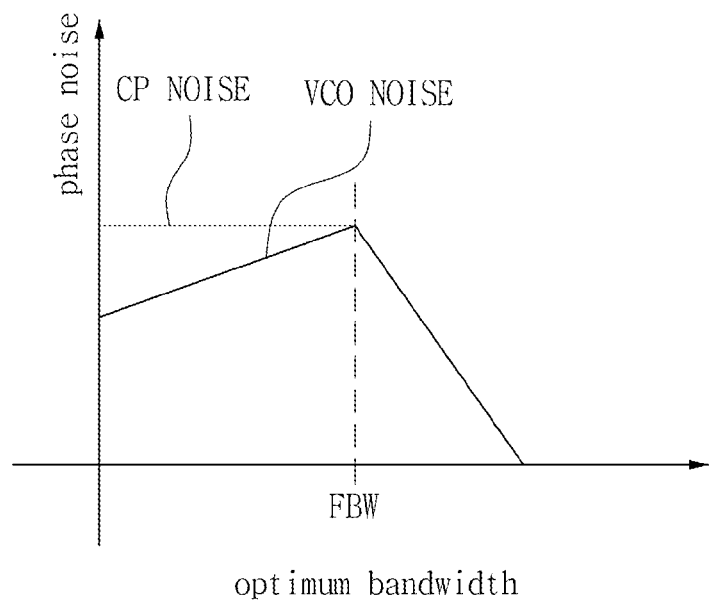
Figure 6C:
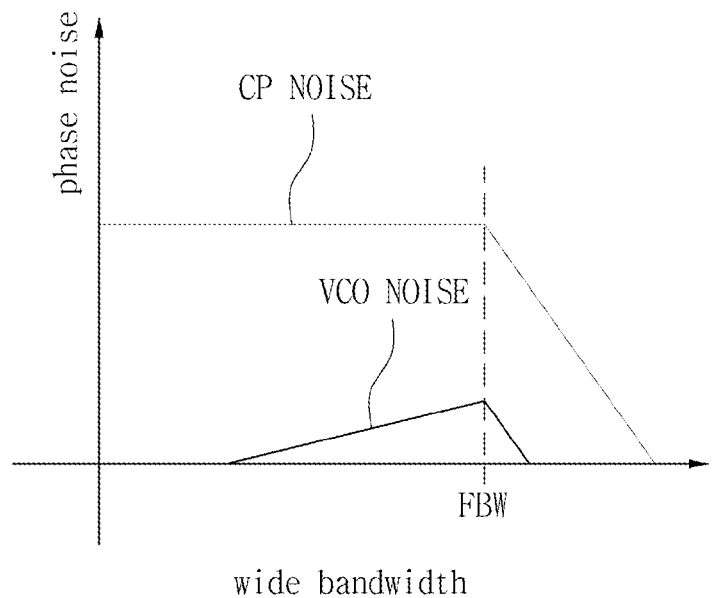
Figure 6D:
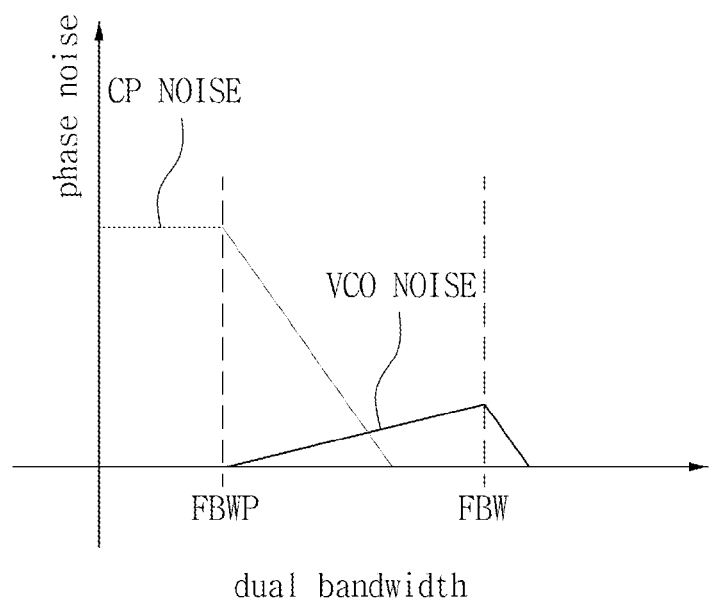

FIGS. 6A to 6D are diagrams illustrating noise properties according to bandwidth and separation of the CP noise and the VCO noise using the second equivalent model 50. FIG. 6A illustrates the CP noise and the VCO noise in a narrow bandwidth, FIG. 6B illustrates the CP noise and the VCO noise in an optimum bandwidth, FIG. 6C illustrates the CP noise and the VCO noise in a wide bandwidth, and FIG. 6D illustrates the CP noise and the VCO noise in a PLL having a dual bandwidth according to an embodiment of the inventive concept.

Referring to FIG. 6D, the PLL having a dual bandwidth may include a first bandwidth FBW having a broad bandwidth for VCO noise and may have a second bandwidth FBWP having a narrow bandwidth for CP noise. The first bandwidth FBW may be determined by the loop bandwidth of the PLL and the second bandwidth FBWP may be determined by the zero filter of block 51. As described above, the VCO noise may have a high-pass property at an output node, and the CP noise may have a low-pass property at the output node on the basis of the bandwidth of the PLL. Therefore, the PLL having dual bandwidths according to embodiments may ignore the trade-off relation between the VCO noise and the CP noise otherwise considered in designing conventional PLLs.

As described above, in the second equivalent model 50 of the PLL, the zero filter of block 51 is disposed in front of the charge pump CP, and thus the transfer function of the CP noise performs low-pass filtering by the zero filter of block 51 added in front of the charge pump CP. Therefore, the VCO noise may be reduced by increasing the loop bandwidth of the PLL, and the CP noise may be reduced by positioning the zero near the origin. The loop bandwidth may be increased by the noise dividing technique using the loop filter division as described above without considering the CP noise, and therefore locking time of the PLL may be minimized.

Figure 7:
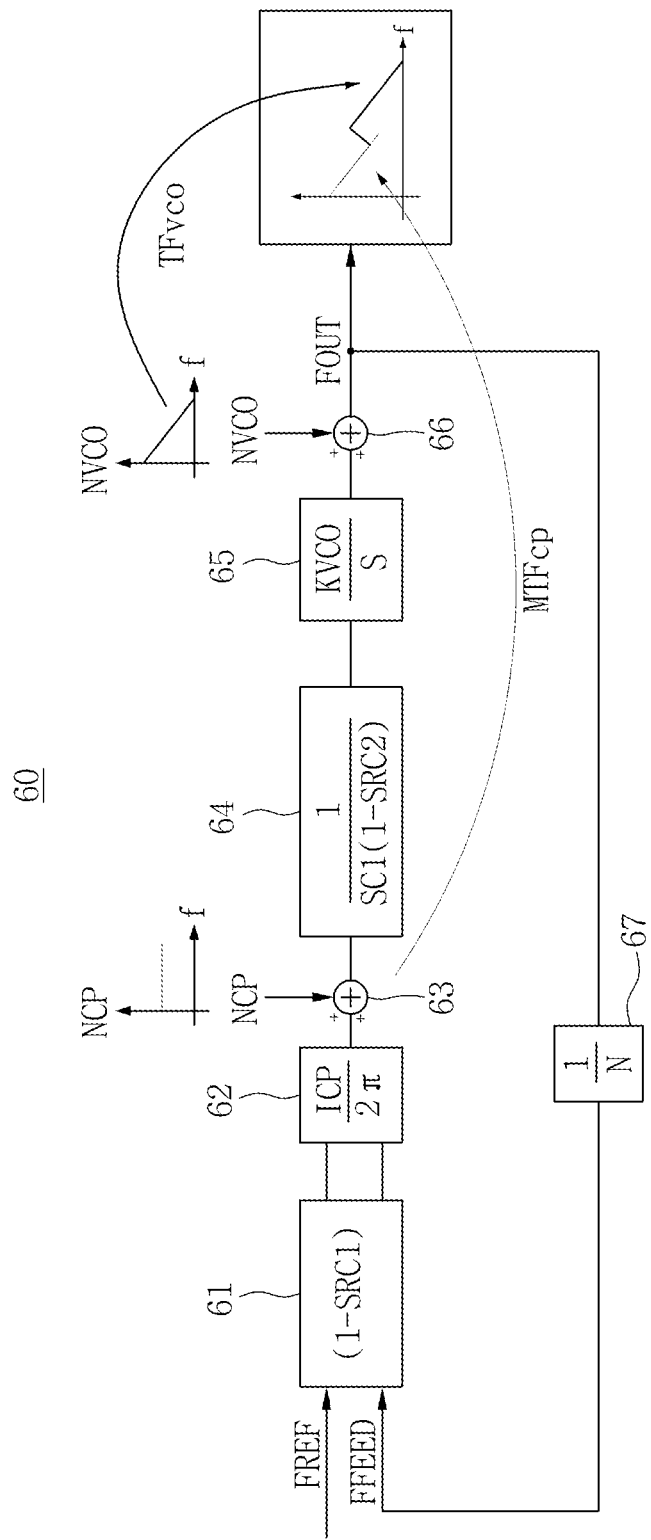
FIG. 7 is a diagram illustrating a linearized S-domain model and a noise transfer property of a PLL using the second equivalent model, according to an embodiment of the inventive concept.

FIG. 7 is a diagram illustrating a linearized S-domain model and a noise transfer property of a PLL using the second equivalent model 50, according to an embodiment of the inventive concept.

In FIG. 7, transfer functions for blocks are shown inside the blocks. Block 61 indicates a zero filter having a transfer function of 1−SRC1, and block 64 indicates a pole filter having a transfer function of 1/(SC1(1−SRC2)). Block 62 indicates a PFD and a charge pump, and generates gain proportional to ICP according to a phase difference between the reference input signal FREF and the feedback signal FFEED, regardless of the frequency of the reference input signal FREF. Block 65 indicates a VCO. Block 67 indicates the frequency divider, and blocks 63 and 66 indicate adders. The adder 63 adds an output of the charge pump and a charge pump noise NCP, and the adder 66 adds an output of the VCO and a VCO noise NVCO. The charge pump noise NCP and the VCO noise NVCO may have waveforms shown in FIG. 7, for example. The VCO 65 generates a gain of KVCO and has one pole at the origin.

Referring to FIG. 7, transfer function $TF_{VCO}$ of the VCO noise seen at output node FOUT may be the same as the conventional transfer function of the VCO noise, but the transfer function $MTF_{CP}$ of the CP noise performs low-pass filtering with the reference of 1/RC1 because of the zero filter of block 61 added in front of the charge pump of in block 62.

Figure 8:
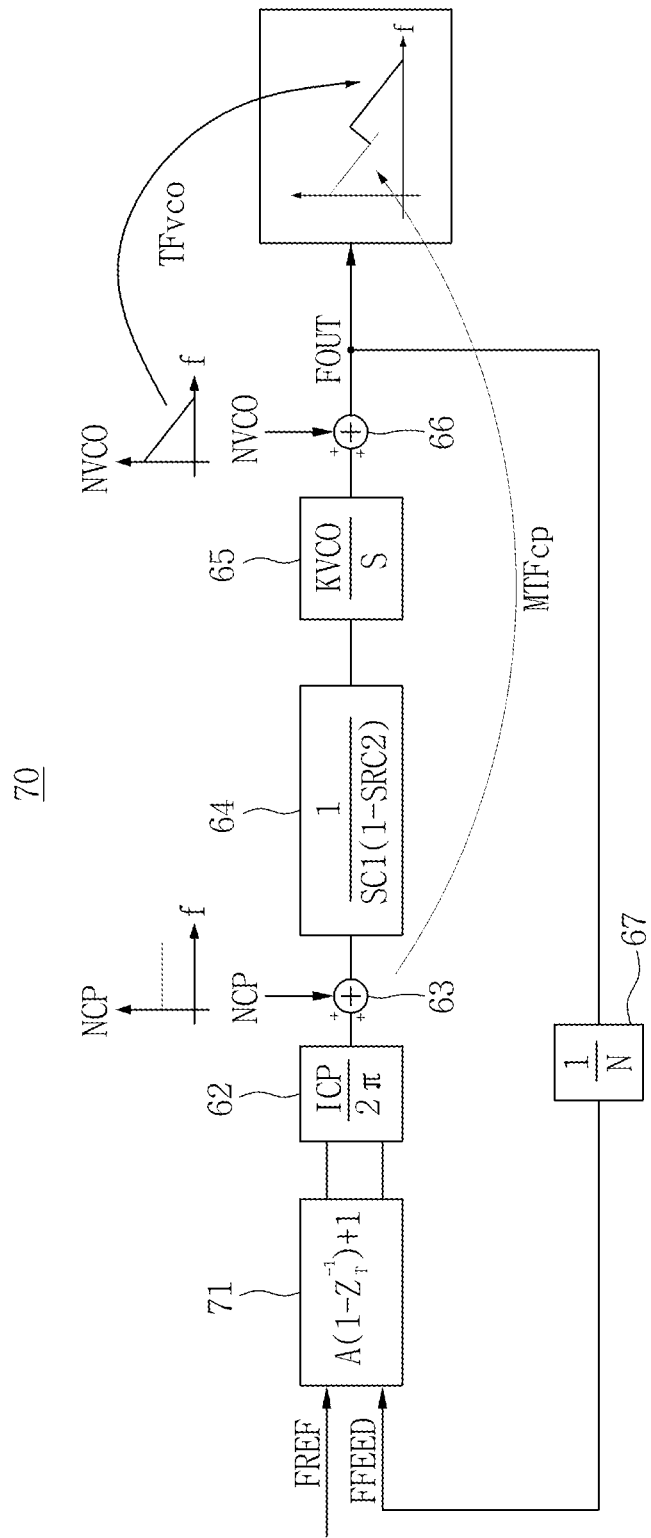
FIG. 8 is a diagram illustrating a linearized S-domain model of a PLL using the second equivalent model, according to an embodiment of the inventive concept.

FIG. 8 is a diagram illustrating a linearized S-domain model of a PLL using the second equivalent model 50, according to an embodiment of the inventive concept.

The zero filter of block 51 shifted to the front of the charge pump CP of block 52 is difficult to design using a conventional analog method. Both the input signal and the output signal of the conventional loop filter including a resistor and a capacitor may be in a voltage domain and may be continuous-time signals, for example.

The input signal and the output signal in the case of the zero filter of block 51 positioned in front of the charge pump of block 52 may be in a time-difference domain and may be discrete-time signals. In various embodiments, a transformed model from an S-domain of FIG. 7 into a Z-domain of FIG. 8 for the transfer function of zero filter 71 to deal with the discrete-time signal. Now, the transfer function of the zero filter 71 in the Z-domain may be expressed by Equation 1:

$$TF = A(1 - Z_T^{-1}) + 1 \tag{Equation 1}$$

Here, A is a constant that determines a position of a zero. A time-difference memory represented by $Z_T^{-1}$, a time-difference amplifier represented by A, and a time-difference adder represented by +/− are needed to use a discrete-time filter with respect to signals of the time-difference domain. The transfer function $(A(1-Z_T^{-1})+1)$ may be rewritten as $((A+1)+(-A*Z_T^{-1}))$.

When a time-difference between the reference input signal FREF and the feedback signal FFEED is ΔTIN, a previous ΔTIN is stored for one period and then amplified by −A, and then is added to a current ΔTIN amplified by A+1, and the resulting time-difference is output.

Figure 9:
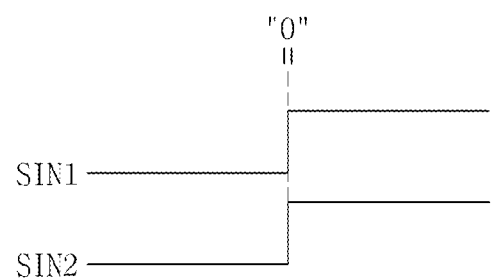
FIGS. 9 and 10 are diagrams illustrating an identity element and an inverse element in a time-difference addition, respectively.
Figure 10:
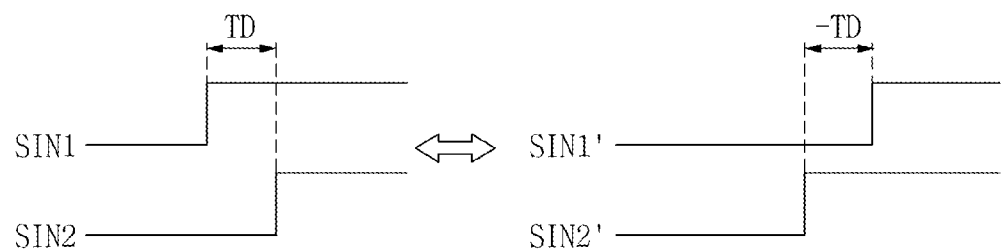
Figure 11:
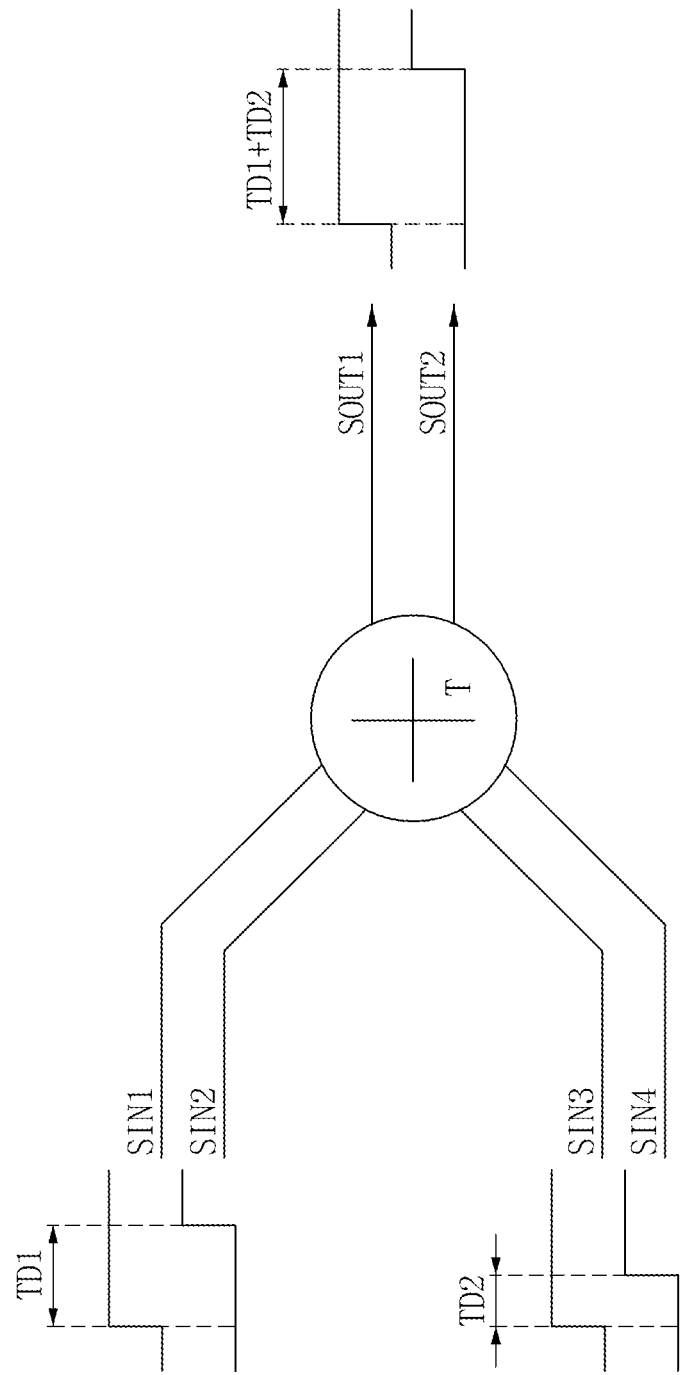
FIG. 11 is a diagram illustrating a time difference adder, according to an embodiment of the inventive concept.

FIGS. 9 to 11 are diagrams illustrating the concept of a signal processing in a time-difference domain. FIG. 9 is a diagram illustrating an identity element, and FIG. 10 is a diagram illustrating an inverse element in a time-difference addition.

As illustrated in FIGS. 9 and 10, an identity element and an inverse element of time difference addition (for which an operator "+" may be used) may be defined with respect to an arbitrary time difference TD. That is, for example, the identity element "0" of the time difference addition satisfies Equation 2 with respect to the arbitrary time difference TD:

TD+0=0+TD=TD (Equation 2)

Further, in the time difference addition with respect to signals having an arbitrary time difference TD, the inverse element −TD of the arbitrary time difference TD satisfies Equation 3:

TD+(−TD)=(−TD)+TD=0 (Equation 3)

FIG. 11 is a diagram illustrating an embodiment of a time difference adder. Referring to FIG. 11, a time difference adder generates a first output signal SOUT1 and a second output signal SOUT2 in response to a first input signal SIN1, a second input signal SIN2, a third input signal SIN3 and a fourth input signal SIN4. The time difference adder may add a first time difference TD1 between the first input signal SIN1 and the second input signal SIN2 and a second time difference TD2 between the third input signal SIN3 and the fourth input signal SIN4, so that the time difference adder outputs the first output signal SOUT1 and the second output signal SOUT2 having a time difference (TD1+TD2) corresponding to a sum of the first time difference TD1 and the second time difference TD2.

Figure 12:
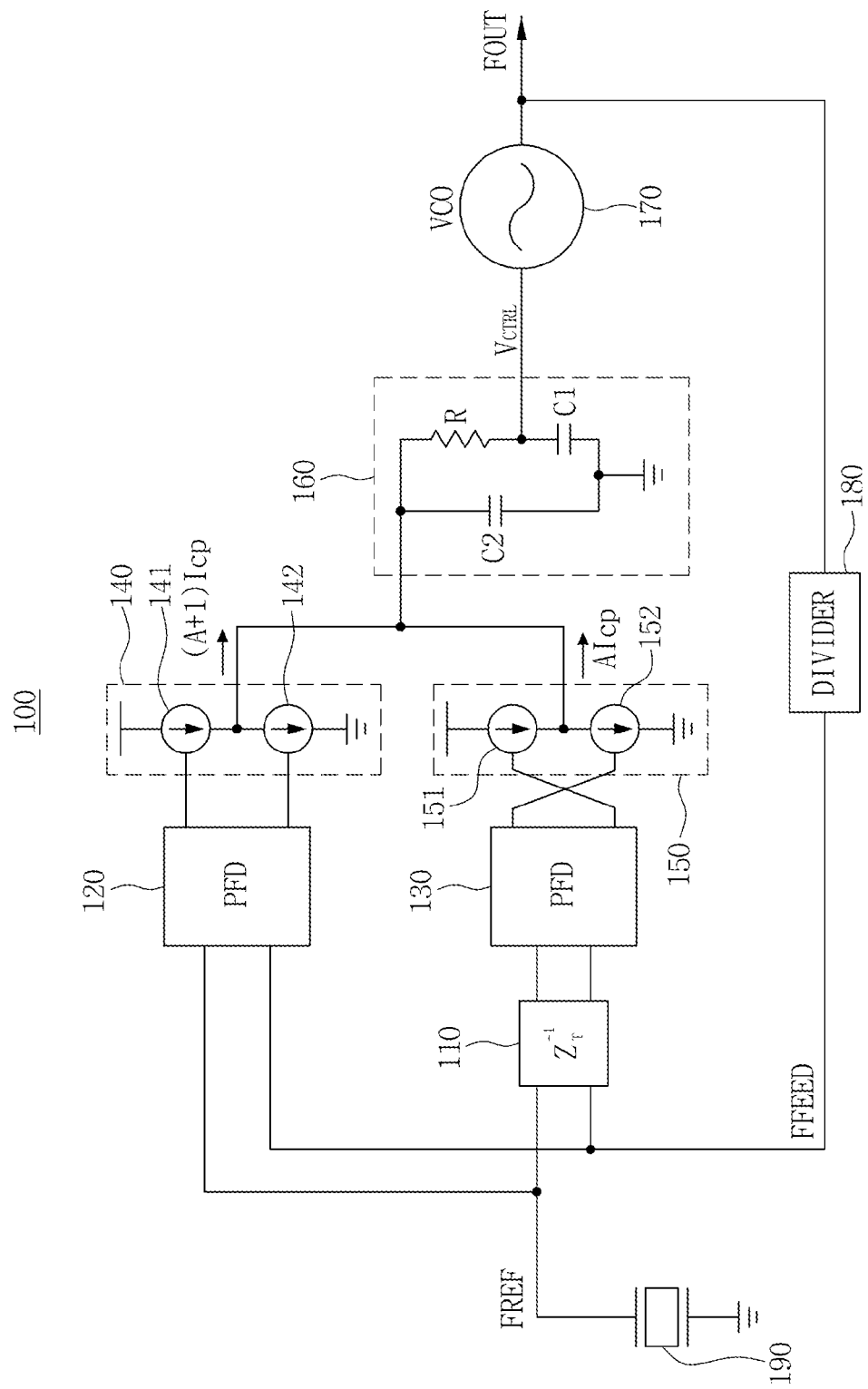
FIG. 12 is a block diagram illustrating a PLL that uses a time-difference memory, according to an embodiment of the inventive concept.

FIG. 12 is a block diagram illustrating a PLL that uses a time-difference memory, in accordance with an embodiment of the inventive concept.

Referring to FIG. 12, PLL 100 includes a time-difference memory 110, a first PFD 120, a second PFD 130, a first charge pump 140, a second charge pump 150, a pole filter 160, a VCO 170, a frequency divider 180 and a crystal oscillator 190.

The time-difference memory 110 stores a first time difference between a reference input signal and a feedback signal. The first PFD 120 generates a first up signal and a first down signal based on a second time difference, which is a current time difference, between the reference input signal and the feedback signal. The second PH) 130 generates a second up signal and a second down signal based on the first time difference received from the time-difference memory. The first charge pump 140 generates a first charge current and a first discharge current in response to the first up signal and the first down signal. The second charge pump 150 generates a second charge current and a second discharge current in response to the second up signal and the second down signal. The pole filter 160 performs filtering on the first charge current, the first discharge current, the second charge current and the second discharge current to generate an oscillation control signal. The VCO 170 generates an output signal having a frequency that changes in response to the oscillation control signal. The frequency divider 180 divides a frequency of the output signal to generate the feedback signal. The crystal oscillator 190 generates the reference input signal FREE The first charge pump 140 includes a first current source 141 that generates the first charge current and a second current source 142 that generates the first discharge current. The second charge pump 150 includes a third current source 145 that generates the second charge current and a fourth current source 152 that generates the second discharge current The pole filter 160 includes a resistor R having a first terminal connected to the first charge pump 140 and the second charge pump 150, and a second terminal connected to an input terminal of the VCO 170. The pole filter 160 further includes a first capacitor C1 connected between the input terminal of the VCO 170 and ground voltage, and a second capacitor C2 having a first terminal connected to the first charge pump 140 and the second charge pump 150 and a second terminal connected to the ground voltage. The pole filter 160 may include poles positioned at the origin and 1/RC1.

As described above, the transfer function $(A(1-Z_T^{-1})+1)$ of the zero filter 71 of FIG. 8 may be expressed as $((A+1)+(-A*Z_T^{-1}))$. In FIG. 12, a gain ratio between A and (A+1) may be implemented by a ratio of output currents of the first charge pump 140 and the second charge pump 150. Further, a negative gain of −A may be implemented by inverting a polarity of output pair of the second PFD 130 and applying the inverted output pair to the second charge pump 150. For example, the first up signal, which is an output of the first PH) 120 is applied to a current source 141 of the first charge pump 140, and the first down signal is applied to a current source 142 of the first charge pump 140. However, the second up signal, which is an output of the second PFD 130 is applied to a current source 152 of the second charge pump 150, and the second down signal is applied to a current source 151 of the second charge pump 150. In FIG. 12, the output signal of the first charge pump 140 is indicated by (A+1)Icp, and the output signal of the second charge pump 150 is indicated by AIcp.

The time-difference memory 110 delays an input signal by one cycle of a sampling clock in a time-difference domain. That is, the time-difference memory 110 stores input time-difference information, and then after one cycle of the sampling clock outputs a time-difference having the same time-difference of the input signal, or the time-difference memory 110 may delay the input signal by one cycle of a sampling clock with the input time-difference being maintained. As shown in FIG. 12, when the time-difference memory 110 is included in the loop of the PLL, a delay time may not be exactly one cycle of the clock. Even though the delay time has some errors, the errors may be averaged by the loop bandwidth of the PLL when the delay time is less than a half cycle of the clock, and do not affect in the result. The time-difference memory 110 may be a delay including an inverter chain.

Figure 13:
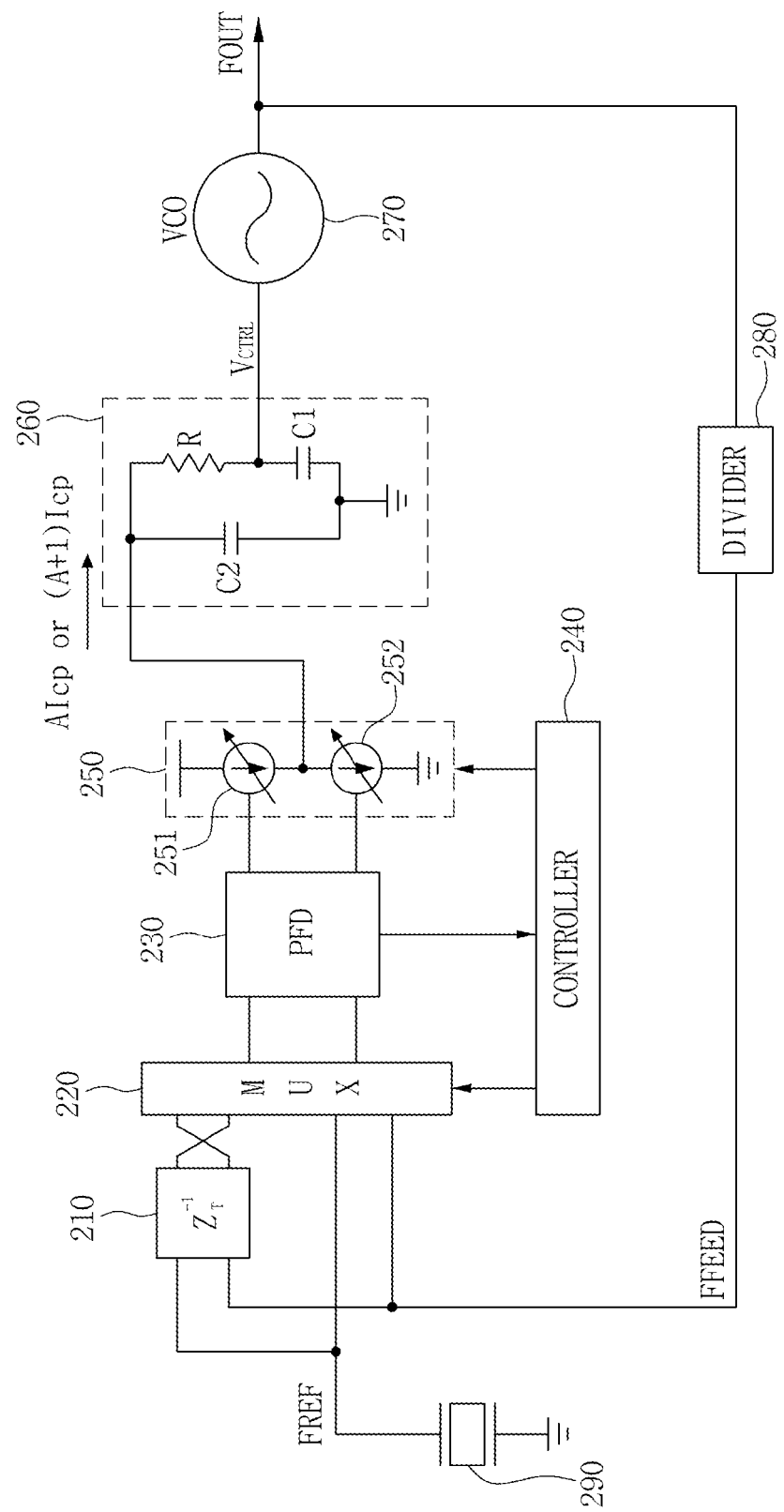
FIG. 13 is a block diagram illustrating a PLL that uses a time-difference memory, according to another embodiment of the inventive concept.

FIG. 13 is a circuit diagram illustrating a PLL that uses a time-difference memory, in accordance with another embodiment of the inventive concept.

Referring to FIG. 13, PLL 200 includes a time-difference memory 210, a multiplexer 220, a PFD 230, a controller 240, a charge pump 250, a pole filter 260, a VCO 270, a frequency divider 280 and a crystal oscillator 290.

The time-difference memory 210 stores a first time difference between a reference input signal and a feedback signal. The multiplexer 220 outputs one of the first time difference received from the time-difference memory 210 and a second time difference that is a current time difference between the reference input signal and the feedback signal. The PH) 230 generates an up signal and a down signal based on an output signal of the multiplexer 220. The charge pump 250 generates a charge current and a discharge current in response to the up signal and the down signal. For example, the up signal output by the first PH) 230 is applied to a first current source 251 of the charge pump 250, and the down signal is applied to a second current source 252 of the charge pump 250. The controller 240 generates control signals based on the up signal and the down signal and controls the multiplexer 220 and the charge pump 250 using the control signals. The pole filter 260 performs filtering on the charge current and the discharge current to generate an oscillation control signal. The VCO 270 generates an output signal having a frequency that changes in response to the oscillation control signal. The frequency divider 280 divides a frequency of the output signal to generate the feedback signal. The crystal oscillator 290 generates the reference input signal FREF. In FIG. 13, the pole filter 260 may have the same configuration as the pole filter 160 in FIG. 12.

The PLL 200 includes one PFD 230 and the charge pump 250, unlike the PLL 100. Therefore, the PLL 200 may prevent a mismatch between charge pumps that may be generated in the PLL of FIG. 12. The PLL 200 control the charge pump 250 using a method of time-division multiplexing.

In FIGS. 12 and 13, though the time-difference function ($Z_T^{-1}$) is implemented by a time-difference memory, the time-difference function may be implemented using a time-difference register, for example, without departing from the scope of the present teachings.

Figure 14A:
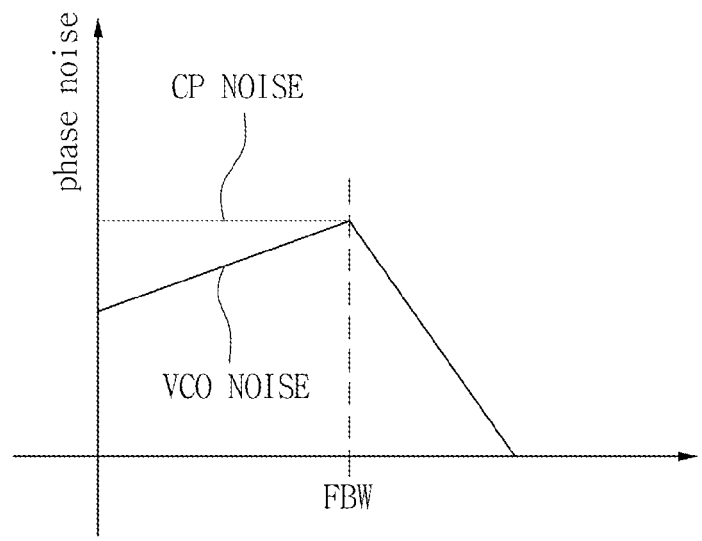
FIGS. 14A to 14C are diagrams illustrating noise properties of a dual-bandwidth PLL, according to embodiments of the inventive concept.
Figure 14B:
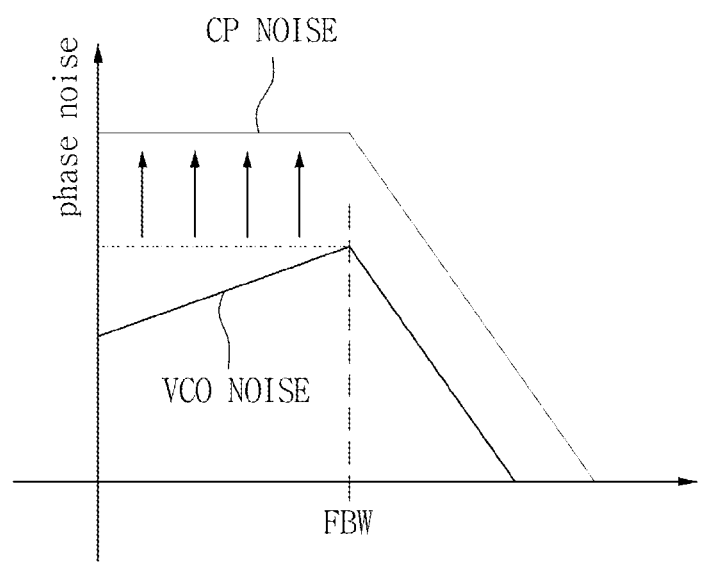
Figure 14C:
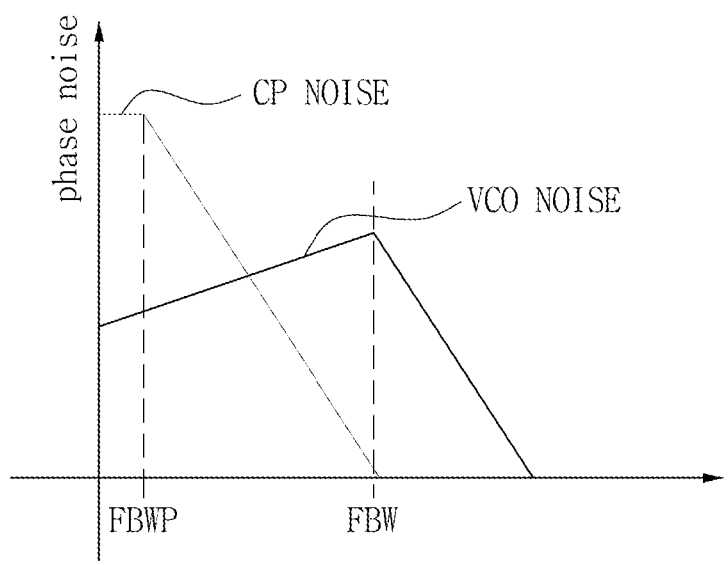

FIGS. 14A to 14C are diagrams illustrating a noise property of a dual-bandwidth PLL, in accordance with embodiments of the inventive concept.

The PLL according to embodiments of the inventive concept may be implemented in a subminiature, for example. In the pole filters 160 and 260 shown in FIGS. 12 and 13, respectively, the first capacitor C1 may occupy the largest area among the register R, the first capacitor C1 and the second capacitor C1. Referring to FIG. 8, the loop gain of the PLL may be determined by ICP*KVCO/(C1*N). Here, ICP denotes an output current of a charge pump, KVCO denotes a gain of the VCO, C1 denotes capacitance of the first capacitor C1, and N denotes a division ratio of the frequency divider. To reduce area of the capacitor C1 with maintaining the same loop property, ICP*KVCO should be decreased at the same rate as the capacitance of the first capacitor C1. However, it is hard to decrease KVCO in order to meet the frequency range of the output signal of the PLL. Therefore, there is a way to decrease a value of C1 and a value of ICP at the same time. The increase of CP noise that may be generated by decreasing ICP may be prevented using the filtering, according to embodiments of the inventive concept.

FIG. 14B illustrates the CP noise and the VCO noise of the PLL when magnitudes of ICP and C1 are decreased by ¹⁄₁₀, compared to the PLL having a property shown in FIG. 14A. It may be noted that the CP noise shown in FIG. 14B is increased compared to the CP noise shown in FIG. 14A. FIG. 14C illustrates the CP noise and the VCO noise of the PLL when the concept of a dual bandwidth according to embodiments of the inventive concept is applied. Referring to FIG. 14C, the PLL has a first bandwidth FBW of a broad bandwidth for VCO noise and a second bandwidth FBWP of a narrow bandwidth for CP noise. The first bandwidth FBW may be determined by the loop bandwidth of the PLL and the second bandwidth FBWP may be determined by the zero filter. As described above, the VCO noise may have a high-pass property at an output node, and the CP noise may have a low-pass property at the output node on the basis of a bandwidth of the PLL, and therefore the influence of the CP noise and the VCO noise on the PLL may be reduced.

Therefore, the PLL having dual bandwidths according to embodiments may ignore the trade-off relation between the VCO noise and the CP noise which must be considered in designing conventional PLLs. As described above, in the second equivalent model 50 of the PLL according to embodiments, the zero filter 51 is disposed in front of the charge pump CP, and the transfer function of the CP noise performs low-pass filtering by the zero filter 51 added in front of the charge pump. Therefore, the VCO noise is reduced by increasing the loop bandwidth of the PLL, and the CP noise is reduced by positioning the zero near the origin.

The loop bandwidth may be increased by the noise dividing technique using the loop filter division as described above without having to consider the CP noise, and therefore locking time of the PLL may be minimized. Further, a phase margin of the PLL may increase as the zero becomes farther from the position of the second pole, and therefore the PLL may be further stably operated.

The PLL according to embodiments of the inventive concept divides a loop filter into a zero filter and a pole filter, disposes the zero filter in front of a PFD, and performs high-pass filtering on VCO noise with a maximum bandwidth and performs low-pass filtering on charge pump noise (CP noise) with a minimum bandwidth to divide the VCO noise and the CP noise. Therefore, in the PLL, the noise property improves and the size of the capacitor included in the pole filter decreases.

Figure 15:
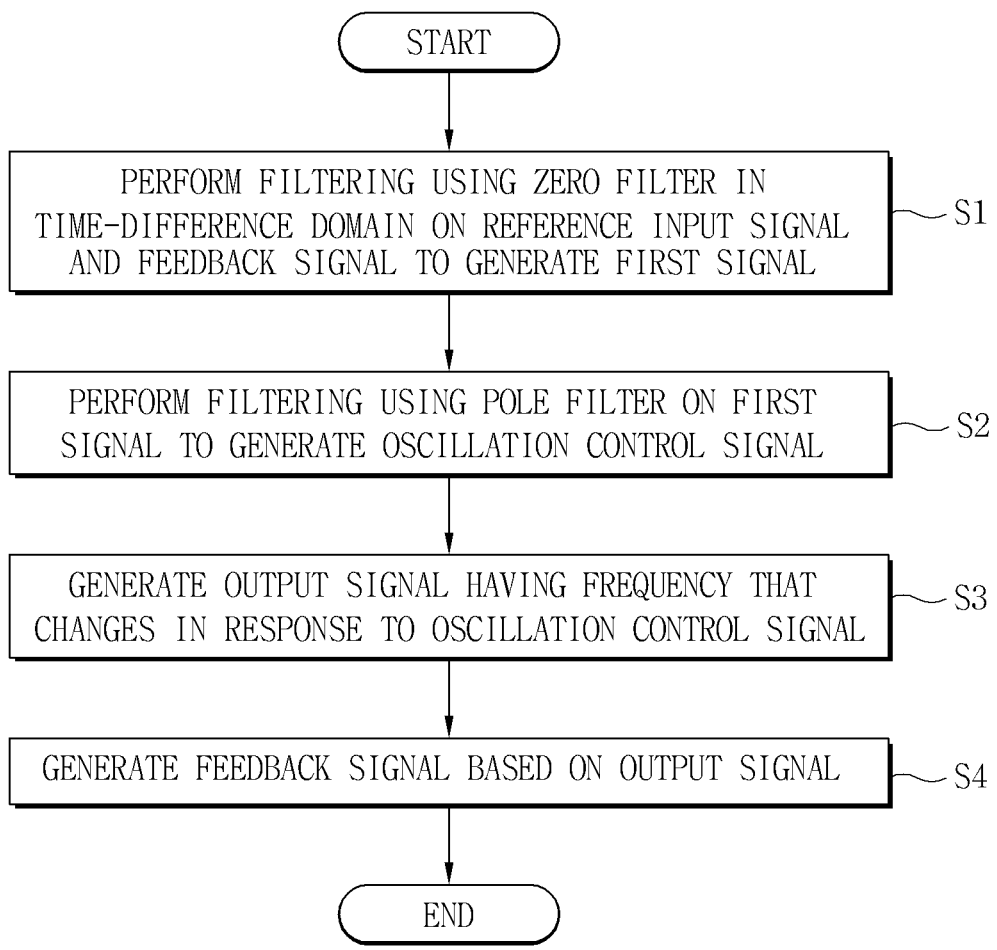
FIG. 15 is a flowchart illustrating a method of operating a PLL, according to an embodiment of the inventive concept.

FIG. 15 is a flowchart illustrating a method of operating a PLL, in accordance with an embodiment of the inventive concept.

Referring to FIG. 15, the method of operating a PLL in accordance with the embodiment of the inventive concept may include the following operations. Filtering is performed using a zero filter in a time-difference domain on a reference input signal and a feedback signal to generate a first signal (S1). Filtering is performed using a pole filter on the first signal to generate an oscillation control voltage (S2). An output signal is generated having a frequency that changes in response to the oscillation control voltage (S3). A feedback signal is generated based on the output signal (S4).

Figure 16:
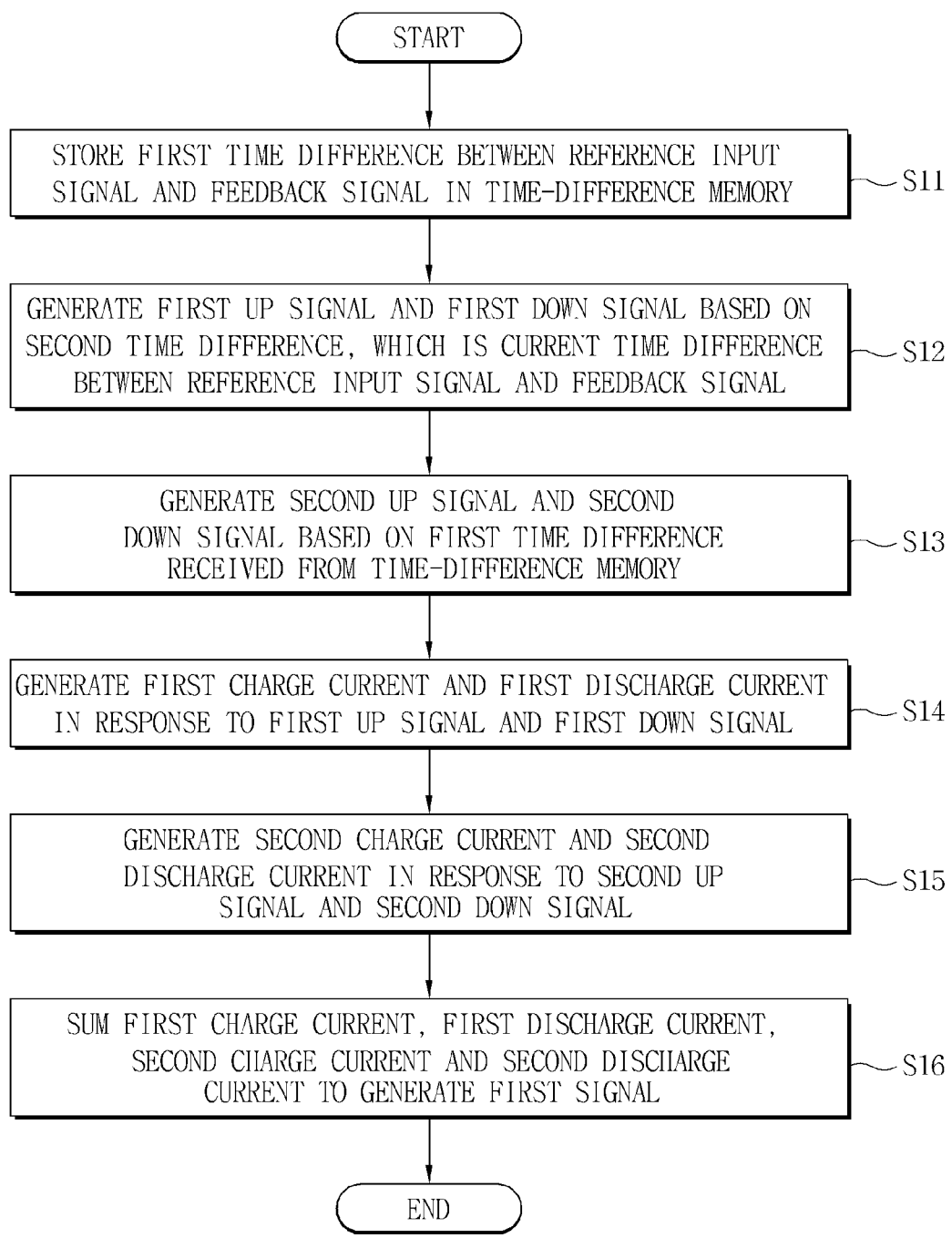
FIG. 16 is a flowchart illustrating a method of filtering using a zero filter in a time-difference domain in the method of operating a PLL of FIG. 15, according to an embodiment of the inventive concept.

FIG. 16 is a flowchart illustrating a method of filtering using a zero filter in a time-difference domain in the method of operating a PLL of FIG. 15, in accordance with an embodiment of the inventive concept.

Referring to FIG. 16, the method of filtering using the zero filter in the time-difference domain may include the following operations. A first time difference between a reference input signal and a feedback signal is stored in a time-difference memory (S11). A first up signal and a first down signal are generated based on a second time difference, which is a current time difference, between the reference input signal and the feedback signal (S12). A second up signal and a second down signal are generated based on the first time difference received from the time-difference memory (S13). A first charge current and a first discharge current are generated in response to the first up signal and the first down signal (S14). A second charge current and a second discharge current are generated in response to the second up signal and the second down signal (S15). The first charge current, the first discharge current, the second charge current and the second discharge current are summed to generate the first signal (S16).

Figure 17:
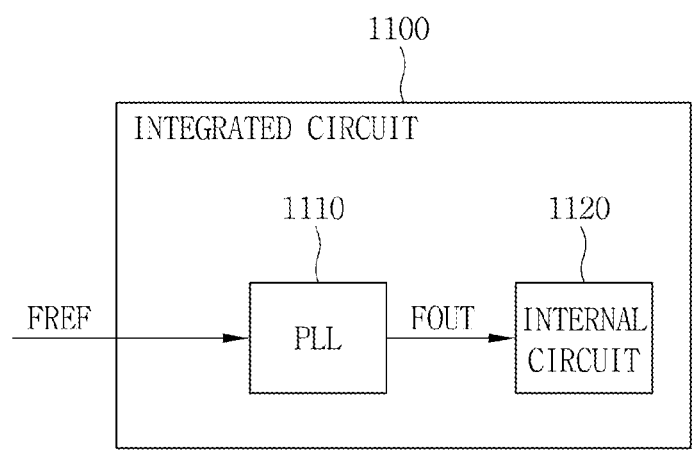
FIG. 17 is a block diagram illustrating an integrated circuit including a PLL, according to embodiments of the inventive concept.

FIG. 17 is a block diagram illustrating an integrated circuit including a PLL, according to embodiments of the inventive concept.

Referring to FIG. 17, an integrated circuit 1100 includes a PLL 1110 and an internal circuit 1120. According to various embodiments, the integrated circuit 1100 may be an application processor (AP), a central processing unit (CPU), an application-specific integrated circuit (ASIC), a mobile system on chip (SoC), a multimedia SoC, a smart card, or like, for example.

The PLL 1110 generates an output signal FOUT having a desired frequency or phase based on a reference input signal FREF. According to various embodiments, the reference input signal FREF may be a wired or wireless signal received from an external circuit or device, or may be an oscillation signal generated by an oscillator located inside or outside the PLL 1110, for example. As discussed above, the PLL 1110 may divide a loop filter into a zero filter and a pole filter, dispose the zero filter in front of a PFD, and perform high-pass filtering on VCO noise with a maximum bandwidth and perform low-pass filtering on charge pump noise (CP noise) with a minimum bandwidth to divide the VCO noise and the CP noise. Therefore, in the PLL 1110, a noise property may be improved and the size of a capacitor included in the pole filter may be decreased.

The PLL 1110 according to various embodiments may be used in frequency synthesis, clock recovery, clock generation, spread spectrum, clock distribution, de-skewing, and/or jitter and noise reduction, for example. The internal circuit 1120 operates based on the output signal FOUT. For example, the internal circuit 1120 may use the output signal FOUT as a clock signal for operating the internal circuit 1120.

Figure 18:
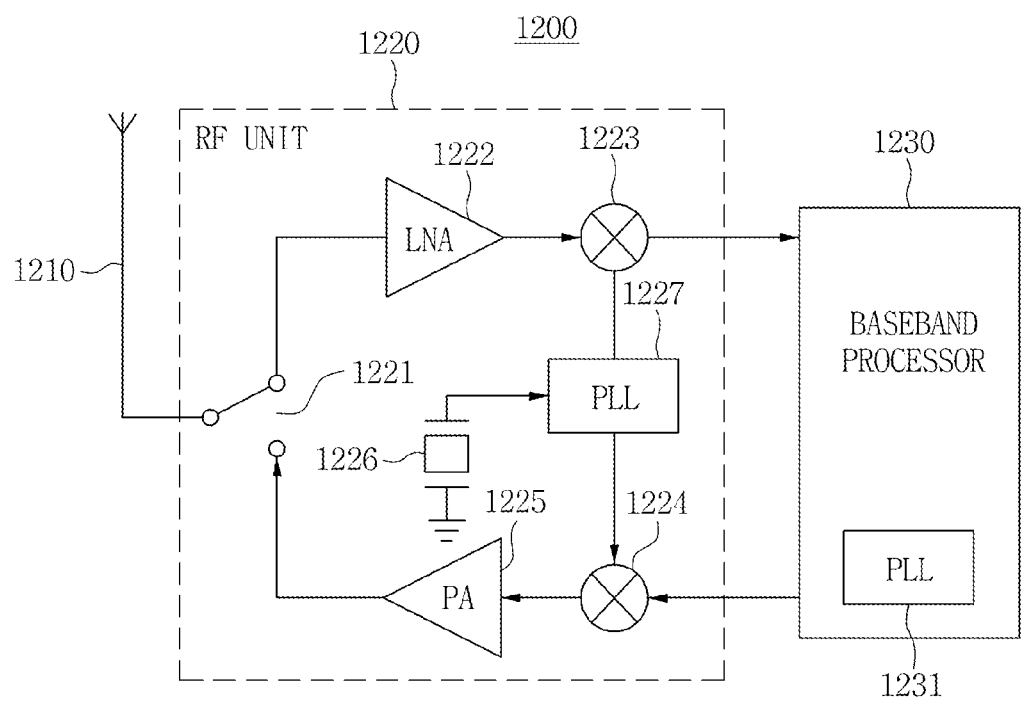
FIG. 18 is a block diagram illustrating a transceiver including PLLs, according to embodiments of the inventive concept.

FIG. 18 is a block diagram illustrating a transceiver including PLLs, according to embodiments of the inventive concept.

Referring to FIG. 18, a transceiver 1200 includes an antenna 1210, a radio frequency (RF) unit 1220 and a baseband processor 1230.

The RF unit 1220 converts a wireless signal received through the antenna 1210 into a baseband signal, and provides the baseband signal to the baseband processor 1230. The RF unit 1220 also may convert a baseband signal provided from the baseband processor 1230 into a wireless signal and transmit the wireless signal through the antenna 1210. In some embodiments, the RF unit 1220 may directly convert the received wireless signal into the baseband signal. In other embodiments, the RF unit 1220 may first convert the received wireless signal into an intermediate frequency (IF) signal, and then may convert the IF signal into the baseband signal. In some embodiments, the RF unit 1220 may convert the received wireless signal into an in-phase baseband signal and a quadrature baseband signal.

In the depicted example, the RF unit 1220 includes a switch 1221, a low noise amplifier (LNA) 1222, a reception mixer 1223, a transmission mixer 1224, a power amplifier (PA) 1225, a local oscillator (LO) 1226 and a first PLL 1227. In some embodiments, the RF unit 1220 may further include a filter for removing a noise or an out-of-band component of the received wireless signal, or for removing an out-of-band spurious component of the wireless signal to be transmitted. According to various embodiments, the RF unit 1220 may further include additional features, such as a variable gain amplifier, a low pass filter, and the like, for example.

The switch 1221 selectively couples the antenna 1210 to a reception path or a transmission path. The LNA 1222 has a relatively low noise figure to reduce an influence of a noise, and amplifies the wireless signal received through the antenna 1210. The reception mixer 1223 down-converts the wireless signal amplified by the LNA 1222 into the baseband signal by mixing the wireless signal with an output signal of the first PLL 1227. The transmission mixer 1224 up-converts a baseband signal provided from the baseband processor 1230 into a wireless signal by mixing the baseband signal with the output signal of the first PLL 1227. The PA 1225 amplifies the wireless signal that is up-converted by the transmission mixer 1224, such that a wireless signal having power greater than or equal to a predetermined power is transmitted through the antenna 1210.

The LO 1226 generates an oscillation signal. For example, the LO 1226 may include a crystal oscillator. The first PLL 1227 generates an output signal having a desired frequency based on the oscillation signal provided from the LO 1226. As discussed above, the first PLL 1227 divides a loop filter into a zero filter and a pole filter, and disposes the zero filter in front of a PFD. The first PLL 1227 performs high-pass filtering on VCO noise with a maximum bandwidth and performs low-pass filtering on a charge pump noise (CP noise) with a minimum bandwidth to divide the VCO noise and the CP noise. Therefore, in the PLL 1110, a noise property may be improved and the size of a capacitor included in the pole filter may be decreased.

The baseband processor 1230 performs data processing based on the baseband signal received from the RF unit 1220, and/or generates a baseband signal to be transmitted to provide the RF unit 1220 with the baseband signal to be transmitted. For example, the baseband processor 1230 may include a physical layer processor (PHY) for generating a data stream by demodulating a baseband signal received from the RF unit 1220 and for generating the baseband signal to be provided to the RF unit 1220 by modulating a data steam. According to various embodiments, the PHY may include a fast Fourier transformer (FFT), a demapper, a deinterleaver, a channel decoder, and the like, for example, to demodulate the baseband signal, and may include a channel encoder, an interleaver, a mapper, an inverse fast Fourier transformer (IFFT), and the like, for example, to modulate the data stream.

The baseband processor 1230 includes a second PLL 1231. For example, the baseband processor 1230 may use an output signal of the second PLL 1231 as a clock signal for operating the baseband processor 1230. As discussed above, the second PLL 1231 may divide a loop filter into a zero filter and a pole filter, dispose the zero filter in front of a PFD, and perform high-pass filtering on VCO noise with a maximum bandwidth and perform low-pass filtering on a charge pump noise (CP noise) with a minimum bandwidth to divide the VCO noise and the CP noise. Therefore, in the PLL 1110, a noise property may be improved and the size of a capacitor included in the pole filter may be decreased.

Figure 19:
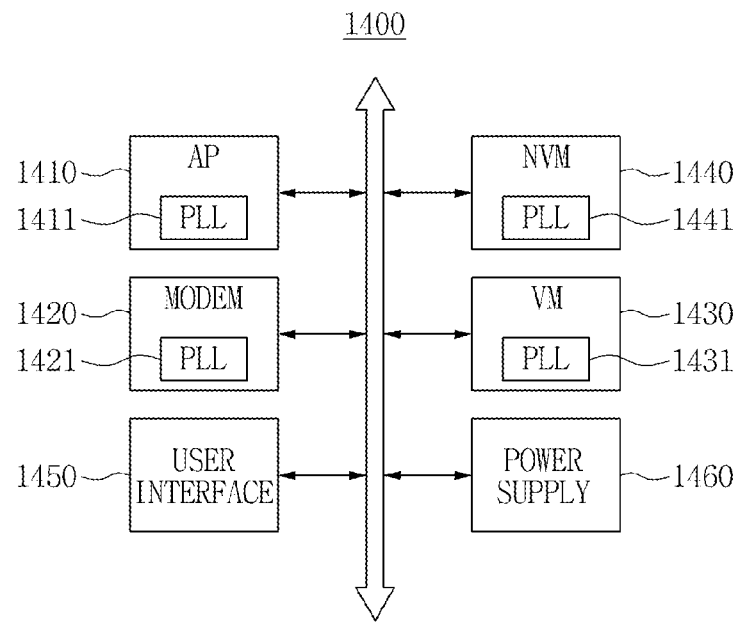
FIG. 19 is a block diagram illustrating a mobile system including PLLs, according to embodiments of the inventive concept.

FIG. 19 is a block diagram illustrating a mobile system including PLLs, according to embodiments of the inventive concept.

Referring to FIG. 19, a mobile system 1400 includes an AP 1410, a modem 1420, a volatile memory (VM) device 1430, a nonvolatile memory (NVM) device 1440, a user interface 1450 and a power supply 1460 (all which may be connected via a bus). According to various embodiments, the mobile system 1400 may be any mobile system, such as a mobile phone, a smart phone, a tablet computer, a laptop computer, a personal digital assistant (PDA), a portable multimedia player (PMP), a digital camera, a portable game console, a music player, a camcorder, a video player, or a navigation system, for example.

The AP 1410 may execute applications, such as an Internet browser, a game application, or a video player application, for example. The AP 1410 may include a first PLL 1411 for frequency synthesis, clock recovery, clock generation, spread spectrum, clock distribution, de-skewing, and/or jitter and noise reduction, for example. The AP 1410 may operate based on a clock signal generated by the first PLL

1411. As discussed above, the first PLL 1411 may divide a loop filter into a zero filter and a pole filter, dispose the zero filter in front of a PFD, and perform high-pass filtering on a VCO noise with a maximum bandwidth and perform low-pass filtering on a charge pump noise (CP noise) with a minimum bandwidth to divide the VCO noise and the CP noise. Therefore, in the PLL 1411, a noise property may be improved and the size of a capacitor included in the pole filter may be decreased. According to various embodiments, the AP 1410 may include a single processor/core or a multi-processor/core. For example, the AP 1410 may be a multi-core, such as a dual-core, a quad-core, or a hexa-core, for example. In some embodiments, the AP 1410 may further include a cache memory located inside and/or outside the AP 1410.

The modem 1420 performs wired or wireless communication with an external device. For example, the modem 1420 may perform Universal Serial Bus (USB) communication, Ethernet communication, near field communication (NFC), radio frequency identification (RFID) communication, mobile telecommunication, memory card communication, wireless Internet, wireless fidelity (Wi-Fi), global positioning system (GPS), Bluetooth (BT), global system for mobile communication (GSM), general packet radio system (GPRS), wideband code division multiple access (WCDMA), or high speed uplink/downlink packet access (HSxPA), for example. The modem 1420 may include a baseband chipset. The modem 1420 may further include a second PLL 1421 for frequency synthesis, clock recovery, clock generation, spread spectrum, clock distribution, and de-skewing, and/or jitter and noise reduction, for example. As discussed above, the second PLL 1421 may divide a loop filter into a zero filter and a pole filter, dispose the zero filter in front of a PFD, and perform high-pass filtering on a VCO noise with a maximum bandwidth and perform low-pass filtering on a charge pump noise (CP noise) with a minimum bandwidth to divide the VCO noise and the CP noise. Therefore, in the PLL 1421, a noise property may be improved and the size of a capacitor included in the pole filter may be decreased.

The VM device 1430 stores instructions/data processed by the AP 1410, and/or serves as a working memory. For example, the VM device 1430 may be implemented by a dynamic random access memory (DRAM), a static random access memory (SRAM), or a mobile DRAM, for example. The VM device 1430 may include a third PLL 1431 for frequency synthesis, clock recovery, clock generation, spread spectrum, clock distribution, de-skewing, and/or jitter and noise reduction, for example. As discussed above, the third PLL 1431 may divide a loop filter into a zero filter and a pole filter, dispose the zero filter in front of a PFD, and perform high-pass filtering on a VCO noise with a maximum bandwidth and perform low-pass filtering on a charge pump noise (CP noise) with a minimum bandwidth to divide the VCO noise and the CP noise. Therefore, in the PLL 1431, a noise property may be improved and the size of a capacitor included in the pole filter may be decreased.

The NVM device 1440 may store a boot image for booting the mobile system 1400. For example, the NVM device 1440 may be implemented by an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), or a ferroelectric random access memory (FRAM), for example. The NVM device 1440 includes a fourth PLL 1441 for frequency synthesis, clock recovery, clock generation, spread spectrum, clock distribution, de-skewing, and/or jitter and noise reduction, for example. As discussed above, the fourth PLL 1441 may divide a loop filter into a zero filter and a pole filter, dispose the zero filter in front of a PFD, and perform high-pass filtering on a VCO noise with a maximum bandwidth and perform low-pass filtering on a charge pump noise (CP noise) with a minimum bandwidth to divide the VCO noise and the CP noise. Therefore, in the PLL 1441, a noise property may be improved and the size of a capacitor included in the pole filter may be decreased.

The user interface 1450 includes at least one input device, such as a keypad, a touch screen, and the like, and at least one output device, such as a display device, a speaker, and the like. The power supply 1460 supplies the mobile system 1400 with an operational voltage. In some embodiments, the mobile system 1400 may further include a camera image processor (CIS), and a storage device, such as a memory card, a solid state drive (SDD), a CD-ROM, etc.

The mobile system 1400 and/or components of the mobile system 1400 may be packaged in various forms, such as a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline IC (SOIC), a shrink small outline package (SSOP), a thin small outline package (TSOP), a system in package (SIP), a multi chip package (MCP), a wafer-level fabricated package (WFP), or a wafer-level processed stack package (WSP).

Figure 20:
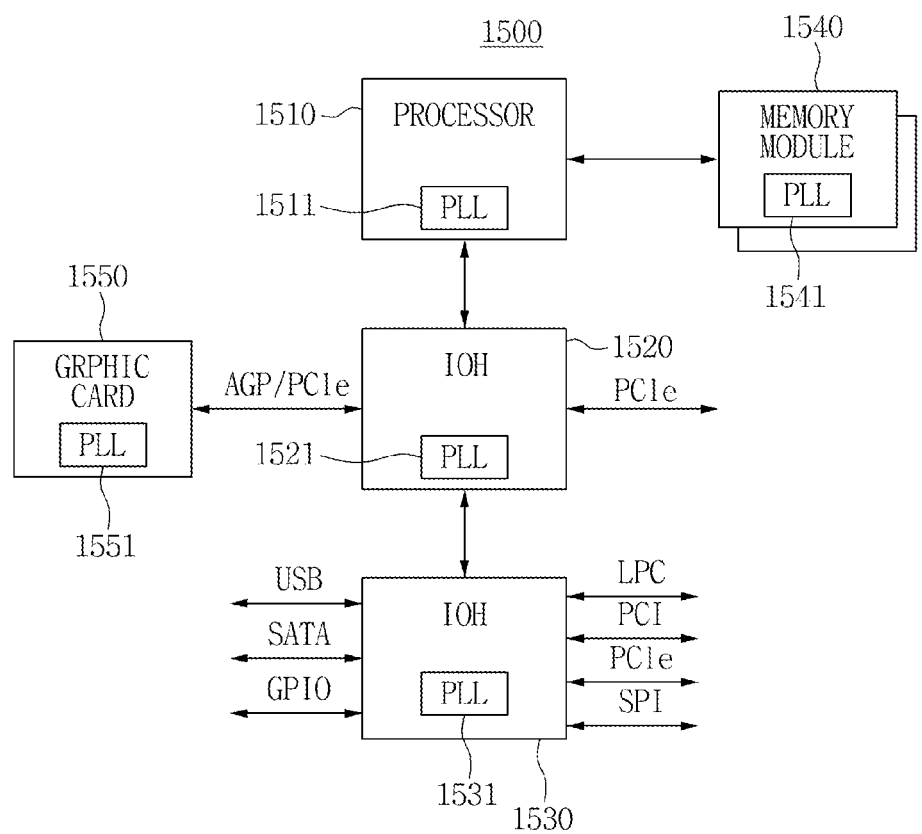
FIG. 20 is a block diagram illustrating a computer system including PLLs, according to embodiments of the inventive concept.

FIG. 20 is a block diagram illustrating a computer system including PLLs, according to embodiments of the inventive concept.

Referring to FIG. 20, a computing system 1500 includes a processor 1510, an input/output hub (IOH) 1520, an input/output controller hub (IOCH) 1530, at least one memory module 1540 and a graphic card 1550. According to the embodiments, the computing system 1500 may be any computing system, such as a personal computer (PC), a server computer, a workstation, a tablet computer, a laptop computer, a mobile phone, a smart phone, a PDA, a PMP, a digital camera, a digital television, a set-top box, a music player, or a portable game console, a navigation device, for example.

The processor 1510 may perform specific calculations and/or tasks. For example, the processor 1510 may be a microprocessor, a CPU, a digital signal processor, or the like. The processor 1510 includes a first PLL 1511 for frequency synthesis, clock recovery, clock generation, spread spectrum, clock distribution, de-skewing, and/or jitter and noise reduction, for example. The processor 1510 may operate based on a clock signal generated by the first PLL 1511. As discussed above, the first PLL 1511 may divide a loop filter into a zero filter and a pole filter, dispose the zero filter in front of a PFD, and perform high-pass filtering on a VCO noise with a maximum bandwidth and perform low-pass filtering on a charge pump noise (CP noise) with a minimum bandwidth to divide the VCO noise and the CP noise. Therefore, in the PLL 1511, a noise property may be improved and the size of a capacitor included in the pole filter may be decreased. According to the embodiments, the processor 1510 may include a single processor/core or a multi-processor/core. For example, the processor 1510 may be a multi-core, such as a dual-core, a quad-core, or a hexa-core, for example. Although FIG. 20 illustrates an example of the computing system 1500 including one processor 1510, according to various embodiments, the computing system 1500 may include a plurality of processors. In some embodiments, the processor 1510 may further include a cache memory located inside or outside the processor 1510.

The processor 1510 may include a memory controller (not shown) that controls an operation of the memory module 1540. The memory controller included in the processor 1510 may be referred to as an integrated memory controller (IMC). A memory interface between the memory controller and the memory module 1540 may be implemented by one channel including a plurality of signal lines, or by a plurality of channels. Each channel may be coupled to at least one memory module 1540. In some embodiments, the memory controller may be included in the IOH 1520. The IOH 1520 including the memory controller may be referred to as a memory controller hub (MCH).

The memory module 1540 may include a plurality of memory devices that store data provided from the memory controller. The memory module 1540 includes a fourth PLL 1541 for frequency synthesis, clock recovery, clock generation, spread spectrum, clock distribution, de-skewing, and/or jitter and noise reduction, for example. In some embodiments, the fourth PLL 1541 may be disposed on the memory module 1540, and may be used to operate a buffer between the memory controller and the memory devices. In other embodiments, the fourth PLL 1541 may be disposed on each memory device, and may be used to operate each memory device. The fourth PLL 1541 may divide a loop filter into a zero filter and a pole filter, dispose the zero filter in front of a PFD, and perform high-pass filtering on a VCO noise with a maximum bandwidth and perform low-pass filtering on a charge pump noise (CP noise) with a minimum bandwidth to divide the VCO noise and the CP noise. Therefore, in the PLL 1541, a noise property may be improved and the size of a capacitor included in the pole filter may be decreased.

The IOH 1520 manages data transfer between the processor 1510 and devices, such as the graphic card 1550. The IOH 1520 includes a second PLL 1521 for frequency synthesis, clock recovery, clock generation, spread spectrum, clock distribution, de-skewing, and/or jitter and noise reduction, for example. As discussed above, the second PLL 1521 may divide a loop filter into a zero filter and a pole filter, dispose the zero filter in front of a PH), and perform high-pass filtering on a VCO noise with a maximum bandwidth and perform low-pass filtering on a charge pump noise (CP noise) with a minimum bandwidth to divide the VCO noise and the CP noise. Therefore, in the PLL 1521, a noise property may be improved and the size of a capacitor included in the pole filter may be decreased.

The IOH 1520 may be coupled to the processor 1510 via at least one of various interfaces, such as a front side bus (FSB), a system bus, a HyperTransport, a lightning data transport (LDT), a QuickPath interconnect (QPI), or a common system interface (CSI), for example. Although FIG. 20 illustrates an example of the computing system 1500 including one IOH 1520, according to the embodiments, the computing system 1500 may include a plurality of IOHs.

The IOH 1520 provides various interfaces with the devices. For example, the IOH 1520 may provide an accelerated graphics port (AGP) interface, a peripheral component interface-express (PCIe), or a communications streaming architecture (CSA) interface, for example.

The graphic card 1550 is coupled to the IOH 1520 via the AGP or the PCIe. The graphic card 1550 controls a display device (not shown) for displaying an image. The graphic card 1550 may include an internal processor and an internal memory to process the image. The graphic card 1550 may further include a fifth PLL 1551 for frequency synthesis, clock recovery, clock generation, spread spectrum, clock distribution, de-skewing, and/or jitter and noise reduction, for example. As discussed above, the fifth PLL 1551 may divide a loop filter into a zero filter and a pole filter, dispose the zero filter in front of a PFD, and perform high-pass filtering on a VCO noise with a maximum bandwidth and perform low-pass filtering on a charge pump noise (CP noise) with a minimum bandwidth to divide the VCO noise and the CP noise. Therefore, in the PLL 1551, a noise property may be improved and the size of a capacitor included in the pole filter may be decreased. In some embodiments, the IOH 1520 may include an internal graphic device along with or instead of the graphic card 1550. The internal graphic device may be referred to as an integrated graphics, and an IOH including the memory controller and the internal graphic device may be referred to as a graphics and memory controller hub (GMCH).

The IOCH 1530 may perform data buffering and interface arbitration to efficiently operate various system interfaces. The IOCH 1530 includes a third PLL 1531 for frequency synthesis, clock recovery, clock generation, spread spectrum, clock distribution, de-skewing, and/or jitter and noise reduction, for example. As discussed above, the third PLL 1531 may divide a loop filter into a zero filter and a pole filter, dispose the zero filter in front of a PFD, and perform high-pass filtering on a VCO noise with a maximum bandwidth and perform low-pass filtering on a charge pump noise (CP noise) with a minimum bandwidth to divide the VCO noise and the CP noise. Therefore, in the PLL 1531, a noise property may be improved and the size of a capacitor included in the pole filter may be decreased.

The IOCH 1530 may be coupled to the IOH 1520 via an internal bus. For example, the IOCH 1530 may be coupled to the IOH 1520 via at least one of various interfaces, such as a direct media interface (DMI), a hub interface, an enterprise Southbridge interface (ESI), and PCIe, for example.

The IOCH 1530 may provide various interfaces with peripheral devices. For example, the IOCH 1530 may provide a USB port, a serial advanced technology attachment (SATA) port, a general purpose input/output (GPIO), a low pin count (LPC) bus, a serial peripheral interface (SPI), a PCI, and a PCIe, for example.

In some embodiments, the processor 1510, the IOH 1520 and the IOCH 1530 may be implemented as separated chipsets or integrated circuits. In other embodiments, at least two of the processor 1510, the IOH 1520 and the IOCH 1530 may be implemented as a single chipset.

The PLL according to embodiments of the inventive concept divides a loop filter into a zero filter and a pole filter, disposes the zero filter in front of a PFD, and performs high-pass filtering on VCO noise with a maximum bandwidth and performs low-pass filtering on charge pump noise (CP noise) with a minimum bandwidth to divide the VCO noise and the CP noise. Therefore, in the PLL, a noise property may be improved and the size of a capacitor included in the pole filter may be decreased.

Example embodiments may be used in any device or system including a PLL, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, and a printer, for example.

The foregoing is illustrative of embodiments and is not to be construed as limiting thereof. While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A phase locked loop (PLL), comprising:
   a time-difference memory configured to store a first time difference between a reference input signal and a feedback signal;
   a first phase-frequency detector configured to generate a first up signal and a first down signal based on a second time difference, which is a current time difference, between the reference input signal and the feedback signal;
   a second phase-frequency detector configured to generate a second up signal and a second down signal based on the first time difference received from the time-difference memory;
   a first charge pump configured to generate a first charge current and a first discharge current in response to the first up signal and the first down signal;
   a second charge pump configured to generate a second charge current and a second discharge current in response to the second up signal and the second down signal;
   a pole filter configured to perform filtering on the first charge current, the first discharge current, the second charge current and the second discharge current to generate an oscillation control signal;
   a voltage-controlled oscillator (VCO) configured to generate an output signal having a frequency that changes in response to the oscillation control signal; and
   a frequency divider configured to divide the frequency of the output signal to generate the feedback signal.

2. The PLL of claim 1, wherein VCO noise of the VCO has a high-pass property at an output node, and charge pump (CP) noise of the first and second charge pumps has a low-pass property at the output node.

3. The PLL of claim 1, wherein the PLL has dual bandwidths comprising a first bandwidth with respect to VCO noise of the VCO and a second bandwidth with respect to charge pump (CP) noise of the first and second charge pumps, the first bandwidth being a broad bandwidth and the second bandwidth being a narrow bandwidth.

4. The PLL of claim 3, wherein the first bandwidth is determined by a loop bandwidth of the PLL, and the second bandwidth is determined by a zero filter.

5. The PLL of claim 4, wherein the zero filter is configured to include the time-difference memory, a time-difference amplifier and a time-difference adder.

6. The PLL of claim 3, wherein, because the PLL has dual bandwidths, a size of a capacitor included in the pole filter decreases and amounts of an output current of the first charge pump and an output current of the second charge pump decrease.

7. The PLL of claim 1 further comprising:
   a zero filter for filtering in a time-difference domain.

8. The PLL of claim 7, wherein a transfer function of the zero filter is configured to be represented by $(A(1-Z_T^{-1})+1)$ in a Z-domain when an amplifier gain is A and a time-difference function is $Z_T^{-1}$.

9. The PLL of claim 8, wherein the time-difference function $(Z_T^{-1})$ is configured to be implemented by a time-difference memory or a time-difference register.

10. The PLL of claim 8, wherein a transfer function of the zero filter is configured to be represented by $((A+1)+(-A*Z_T^{-1}))$, and a gain ratio between A and (A+1) is implemented by a ratio of output currents of the first charge pump and the second charge pump, and a negative gain of −A is implemented by inverting a polarity of an output pair of the second phase-frequency detector and applying the inverted output pair to the second charge pump.

11. The PLL of claim 8, wherein the time-difference memory having the time-difference function $(Z_T^{-1})$ is configured to include a delay that delays the reference input signal and the feedback signal.

12. A method of operating a phase locked loop (PLL), the method comprising:
   performing filtering using a zero filter in a time-difference domain on a reference input signal and a feedback signal to generate a first signal;
   performing filtering using a pole filter on the first signal to generate an oscillation control signal; and
   generating an output signal having a frequency that changes in response to the oscillation control signal.

13. The method of claim 12, wherein a transfer function of the zero filter is configured to be represented by $(A(1-Z_T^{-1})+1)$ in a Z-domain when an amplifier gain is A and a time-difference function is $Z_T^{-1}$.

14. The method of claim 12, wherein generating the first signal comprises:
   storing a first time difference between a reference input signal and a feedback signal in a time-difference memory;
   generating a first up signal and a first down signal based on a second time difference, which is a current time difference, between the reference input signal and the feedback signal;
   generating a second up signal and a second down signal based on the first time difference received from the time-difference memory;
   generating a first charge current and a first discharge current in response to the first up signal and the first down signal; and
   generating a second charge current and a second discharge current in response to the second up signal and the second down signal.

15. The method of claim 14, wherein the generating of the first signal further comprises summing the first charge current, the first discharge current, the second charge current and the second discharge current.

* * * * *